United States Patent [19]

Ishigaki

[11] Patent Number: 5,731,618
[45] Date of Patent: Mar. 24, 1998

[54] SEMICONDUCTOR DEVICE AND METHOD OF MANUFACTURING THEREOF

[75] Inventor: Yoshiyuki Ishigaki, Hyogo, Japan

[73] Assignee: Mitsubishi Denki Kabushiki Kaisha, Tokyo, Japan

[21] Appl. No.: 560,099

[22] Filed: Nov. 17, 1995

[30] Foreign Application Priority Data

Apr. 24, 1995 [JP] Japan ................. 7-098178

[51] Int. Cl.$^6$ ................... H01L 27/092; H01L 27/11
[52] U.S. Cl. ................... 257/372; 257/903; 257/207; 257/547
[58] Field of Search ................ 257/903, 369, 257/372, 207, 544, 547, 550, 377

[56] References Cited

U.S. PATENT DOCUMENTS

| | | | |
|---|---|---|---|
| 4,570,331 | 2/1986 | Eaton, Jr. et al. | 257/532 |
| 5,243,219 | 9/1993 | Katayama | 257/547 |
| 5,396,100 | 3/1995 | Yamasaki et al. | 257/390 |
| 5,422,499 | 6/1995 | Manning | 257/67 |
| 5,461,251 | 10/1995 | Yang et al. | 257/379 |

FOREIGN PATENT DOCUMENTS 62-293670 12/1987 Japan.
6-97392 4/1994 Japan.
1-119058 10/1997 Japan.

OTHER PUBLICATIONS

"A Split Wordline Cell for 16Mb SRAM Using Polysilicon Sidewall Contracts," Kazuo Itabashi, et al., Tech. Dig. IEDM 1991, pp. 477–480.

Primary Examiner—Jerome Jackson
Assistant Examiner—John Guay
Attorney, Agent, or Firm—Lowe, Price, LeBlanc & Becker

[57] ABSTRACT

The earth wire is a conductive lead located at the nearest position to a flat surface of the semiconductor substrate, and the earth wire and the word lines are arranged so that these are not formed on the other wires in the memory cell, the wiring resistance is reduced by shortening the wiring length, and there is little unevenness in the underlayer of the earth wire, whereby the read-out operation is stabilized. Furthermore, the earth wire is formed of a wiring layer which is near to the semiconductor substrate, so that the distance between the earth wire and a load element is set to be larger than that in the prior art. Therefore, it can be prevented that the earth wire acts as the gate electrode of a parasitic transistor and thus malfunction occurs. In addition, the shape of the field pattern can be simplified.

15 Claims, 28 Drawing Sheets

SEMICONDUCTOR DEVICE AND METHOD OF MANUFACTURING THEREOF

BACKGROUND OF THE INVENTION

The present invention relates to a semiconductor device such as a large scale integrated circuit (LSI), and particularly to a semiconductor device having SRAM (Static Random Access Memory).

SRAM is a volatile semiconductor storage device, and it is designed so that memory cells are arranged at cross points between complementary data lines (bit lines) and word lines which are arranged in a matrix (matrix) form. As shown in a circuit diagram of FIG. 24A, a memory cell 1 comprises a flip flop circuit 2 in which two driver transistors 3a and 3b are connected to load elements 5a and 5b through storage nodes 4a and 4b, and access transistors 6a and 6b which are connected to the storage nodes 4a and 4b in the flip flop circuit 2, respectively. A potential is applied from a word line 7 to the gate electrodes of the access transistors 6a and 6b to control conductive and non-conductive states of the transistors. Furthermore, the source/drain electrodes of the access transistors 6a and 6b are connected to bit lines 8a and 8b respectively, and the respective bit lines 8a and 8b apply potential to the source/drain electrodes of the access transistors 6a and 6b. The electrodes of the load elements 5a and 5b at the sides thereof which are not connected to the storage nodes 4a and 4b are connected to a power source line (Vcc line), and the electrodes of the access transistors 3a and 3b which are located at the sides thereof which are not connected to the storage nodes are connected to an earth wire (Vee line) 10. In another expression, the flip flop circuit 2 is equivalent to such a structure that two invertor circuits are combined with each other and the output information of one invertor circuit is connected to the output information of the other invertor circuit.

The flip flop circuit 2 of the memory cell 1 as described above provides the two cross-coupled storage nodes 4a and 4b with such a characteristic that they have a bistable state of "High" "Low" or "Low" "High" and this bistable state is continued to be kept insofar as prescribed potential is applied to the power source line 9 and the earth wire 10 in the flip flop circuit 2.

Next, data write-in and read-out operations will be described.

First, in a case where data are written into the memory cell shown in FIG. 24, a word line 7 is selected to be activated, thereby keeping the access transistors 6a and 6b to the conductive state, and voltages are forcedly applied to the bit line pair 8a and 8b in accordance with desired logical values to set the bistable state of the flip flop circuit 2 to "High", "Low" or "Low", "High".

On the other hand, in a case where data are read out, the access transistors 6a and 6b are set to the conductive state, and the potential values of the storage nodes 4a and 4b are transferred to the bit lines 8a and 8b through the access transistors 6a and 6b. The transferred potential is read out by a sense amplifier.

In such an SRAM memory cell 1, the access transistors 6a and 6b are set to the conductive state during the data read-out operation, and in this case it has been generally known that when the word line 7 is activated, current which is called as column current, flows through the bit lines 8a and 8b, the access transistors, the storage node at the "Low" side, the driver transistors and the earth wire 10, and thus the potential of the earth wire 10 rises up to predetermined potential or more, so that the potential of the storage node at the "Low" side approaches to the potential of "High" and thus stored data are damaged. Accordingly, it is important to reduce the resistance of the earth wire.

Particularly, the symmetry in characteristics of the respective invertor circuits which are constituent elements of the flip flop circuit 2 in the SRAM memory cell 1 is an important factor to hold data in the memory cell. In order to improve the symmetry, a split word line type memory cell having high symmetry structure in which a word line is splitted, as disclosed in IEDM 91, P477 to 480, has been proposed and practically used. In such a memory cell, the earth wire is formed of a conductive film as an upper layer located above the word line.

FIG. 25A is a plan view of a conventional SRAM memory cell, which has the same circuit construction as that of FIGS. 24A and 24B. FIG. 25B is a cross-sectional view of a main part of the SRAM memory cell of the conventional semiconductor device shown in the plan view of FIG. 25A, which is taken along a line Y—Y, and FIGS. 26 and 27 show structures which are obtained during a manufacturing process of FIG. 25. Like FIG. 25, FIG. 26A is a plan view of the memory cell, and FIG. 27B is a cross-sectional view of a main part of the memory cell.

Referring to FIG. 25B, reference numeral 11 represents a semiconductor substrate containing P-type impurities, reference numeral 12 represents an N-type well region which is formed in the semiconductor substrate 11, reference numeral 13 represents a field oxide film (represents an inactive region in the plan view (a)) which is formed on the surface of the semiconductor substrate 11, reference numeral 14 represents a wire having a two-layer structure comprising a polycrystal silicon film 14b and a metal silicide film 14a, that is, a word line serving as the gate electrode of an access transistor, reference numeral 15 represents a gate oxide film which is formed so as to be interposed between the word line 14 and the surface of the semiconductor substrate 11, and reference numerals 16a to 16d represent elements constituting the source/drain region of a MOS transistor (access transistor), which are formed on the surface of the semiconductor substrate 11. The elements 16a and 16b correspond to low-concentration impurity regions, and the elements 16c and 16d correspond to high-concentration impurity regions. With the formation of these elements, the source/drain region can be designed in an LDD (Lightly Doped Drain) structure. Reference numeral 17 represents the gate electrode of a driver transistor which comprises a polycrystal silicon film 17b and a metal silicide film 17a and which is formed simultaneously with the word line 14, reference numeral 18 represents an earth wire which is disposed above the driver transistor so as to be partially overlapped with the driver transistor and is also formed so as to extend in an oblique direction with respect to the center of the memory cell, reference numeral 19a represents a conductive film serving as the gate electrode of a load element (P-channel type TFT (Thin Film Transistor)) which is formed in contact with the gate electrode 17 of one driver transistor, reference numeral 19b represents a conductive film serving as the gate electrode of another load element which is formed in contact with the gate electrode of the other driver transistor, reference numeral 20a represents a conductive film which is formed above the word line 14 through an insulating film and can be the source/drain region of the P-channel type TFT (load element) having the gate electrode 19a, reference numeral 20b represents a conductive film which can be the source/drain region of the another P-channel type TFT having a gate electrode 19b, and reference numerals 28a, 28b and 28c represent insulating films of silicon dioxide.

In FIG. 25A, reference numeral 21 represents an inactive region which is covered with a field oxide film, reference numerals 22a and 22b represent active regions, reference numerals 23a and 23b represent contacts through which the earth wire 18 is connected to the active regions 22a and 22b which are formed below the earth wire 18, and reference numerals 24a and 24b represent contacts through which the load elements are connected to the source/drain regions of the driver transistors. The bit lines 8a and 8b shown in the circuit diagram (FIGS. 24A and 24B) are formed above any wires of the laminate structure shown in FIG. 25B, and thus illustration of the bit lines 8a and 8b and description thereof are omitted from FIG. 25.

Next, a process of manufacturing the semiconductor device shown in FIG. 25 will be described.

In the prior art, an N-type impurity region 12 is formed on the surface of the semiconductor substrate 11 containing P-type impurities as shown in FIG. 26. Thereafter, an oxidation-resistant mask of silicon nitride film or the like is formed those regions which will be the active regions 22a and 22b, and then field oxidation is performed to form a field oxide film 13 of silicon dioxide on an area which will be the inactive region 21. Thereafter, the film which is used as the mask is removed, then a gate oxide film 15 is formed and then the gate oxide film 15 is selectively removed at a portion which will be the contact 25. Subsequently, the polycrystal silicon film 14b containing N-type impurities and the metal silicide film 14a are successively laminated on the whole surface of the semiconductor substrate, and then an insulating film 26 of silicon dioxide is deposited thereon.

Next, a resist pattern having the same shape as the word line 14 serving as the gate electrode 17 of the driver transistor and the gate electrode of the access transistor is formed on the insulating film 26, and the insulating film 26, the metal silicide films 14a and 17a and the polycrystal silicon films 14b and 17b which are located below the resist pattern are successively etched using the resist pattern as a mask to obtain such a structure as shown in FIGS. 26A and 26B.

Thereafter, as shown in FIGS. 27A and 27B, an insulating film of silicon oxide film or the like is deposited on the whole surface of a memory-cell forming area by a CVD technique, and then an anisotropic etching treatment is performed to form side walls 27 so that the side walls 27 are attached to the section of the wiring layers of the gate electrode 17 and the word line 14. Subsequently, an insulating film 28a of silicon dioxide or the like is formed on the whole surface of the memory-cell forming area in the same manner as described above by the CVD technique. Thereafter, the insulating film is selectively removed so that one electrode of the source/drain region of the driver transistor is exposed, and a contact hole is formed. Subsequently, a conductive material is deposited on the whole surface of the memory cell forming area by the CVD technique, and then a patterning treatment is performed to form an earth wire 18 so that the earth wire 18 comes into contact with one electrode of the driver transistor through the contacts 23a, 23b formed of the conductive material which is embedded into the contact hole.

If the earth wire 18 thus formed is viewed in a plan view, it is apparent that it is formed so as to be overlapped with the gate electrode 17 of the driver transistor having the two-layer structure which are located below the earth wire 18. However, as shown in the cross-sectional view of (b), each of the word line 14 and the gate electrode 17 is not designed by an ordinary wiring using polycrystal silicon layer, but it is designed in a two-layer structure in which a polycrystal silicon wire and a metal wire are attached to each other. Therefore, there is a large step (unevenness) between the wiring layer surface of the word line 14 and the gate electrode 17 and the semiconductor substrate surface, and this step causes increase of the wiring length of the earth wire 18 which is formed on these wires.

Thereafter, conductive films 19a and 19b which will be the gate electrode of the P-channel type TFT serving as a load element are formed through the contacts 24a and 24b respectively so as to be contacted with the gate electrode 17 of the driver transistor, and conductive films 20a and 20b which will be the source/drain region of the P-channel type TFT serving as a load element are successively formed, whereby the semiconductor device shown in FIG. 25 can be obtained.

In the prior art, wires formed of thick layers are formed below the earth wire 18 as described above, and thus the wiring resistance increases as the wiring length of the earth wire 18 is large, resulting in malfunction of the device in a data read-out operation. Furthermore, the earth wire 18 is located near to the P-channel type TFT as shown in FIG. 25B and thus it works like a gate electrode. This causes such malfunction of the load element that the load element is erroneously kept in a conductive state. In addition, the contacts 24a and 24b through which the gate electrode and one source/drain region of the load element and the gate electrode of the driver transistor are connected to each other are formed just above the driver transistor. Therefore, in the prior art the earth wire 18 must be formed in a bent shape, and this also causes increase of the wiring length.

The conventional semiconductor device is constructed as described above. Therefore, the earth wire is formed above the driver transistor which is formed on the semiconductor substrate, so that unevenness of the wires formed on the lower layers becomes great. Accordingly, there is a problem that the effective wiring length is increased. The increase of the wiring resistance causes variation (increase) of the ground potential when the column current flows into the earth wire in a read-out operation, and thus it causes malfunction in read-out operation of the memory cell. In addition, there is also a problem that breaking of wire occurs when the unevenness in the vertical direction of the wiring is remarkably large.

Furthermore, in the conventional semiconductor device, the field oxide film is formed so as to be interposed between the two storage nodes to separate the storage nodes in the memory cell. However, when the field oxide film is formed, there occurs a step on the surface of the oxide film because the thickness of the oxide film is large. Due to the step of the oxide film, the earth wire formed above the oxide film is also designed to have a step structure, so that there occurs a problem that the wiring resistance of the earth wire as well as the effective wiring length of the earth wire increases. Furthermore, the pattern of the field oxide film is more complicated, and thus it is difficult to perform the patterning treatment.

Furthermore, in the conventional semiconductor device, the contact hole for connecting the storage node and the load element is formed so as to be disposed just above the driver transistor. Therefore, the earth wire must be formed so as to avoid the contact hole, so that the wiring width of the earth wire is lowered and thus the wiring resistance is increased.

Still furthermore, in the conventional semiconductor device, the word line is generally designed in a low-resistance wiring structure, for example, in such a two-layer structure as to be formed of polycrystal silicon film and a metal silicide film, that is, in a so-called polycide structure. This structure can enable the resistance thereof to be more lowered as compared with a wiring layer which has the same thickness and is formed of only a polycrystal silicon film. However, the number of process steps of forming the polycide-structured wiring layer having the two-layer structure is increased, and the frequency of an etching treatment is increased, so that the manufacturing process is more complicated.

Still furthermore, in order to stabilize the earth potential, the earth wiring is also required to be formed of a wiring layer comprising two layers, a polycrystal silicon film and a metal silicide film. In this case, the resistivity of the wiring layer itself is lowered, however, the effective wiring length thereof is increased at a portion thereof below which the word line is formed, or there is an uneven portion such as the field oxide film or the like, so that there is a problem that the resistance is increased.

Still furthermore, in the conventional semiconductor device, when a P-channel type TFT (Thin Film Transistor) is connected as a load element of the flip flop circuit in the memory cell, the earth wire must be disposed at the upper portion of the channel region or at the lower portion of the channel region. Therefore, the earth wire acts as a parasitic gate electrode, and causes malfunction.

SUMMARY OF THE INVENTION

The present invention has been made in view of the foregoing problems, and aims to reduce the wiring resistance by moderating unevenness of the earth wire and decreasing the effective wiring length in a semiconductor device, particularly in an SRAM, to facilitate a patterning treatment by simplifying the shape of a field oxide film, thereby preventing increase of the wiring length of a wiring layer formed on the field oxide film. In addition, the present invention aims to prevent the earth wire from acting as a parasitic gate electrode to suppress the malfunction when a P-channel type TFT is formed as a load element. Furthermore, and the present invention has been achieved to suppress, as much as possible, formation of conductive layers each having a two-layer structure comprising a polycrystal silicon film and a metal silicide film used as a wiring structure to reduce resistance in view of reduction of the number of steps.

A semiconductor device containing an SRAM according to the present invention is characterized in that at least a word line and an earth wire formed in a memory cell are formed of conductive wires, wherein the earth wire is located at the nearest position to a flat surface of the semiconductor substrate, and the word line and the earth wire are disposed away from each other in a direction parallel to the one flat surface of the semiconductor substrate without crossing each other.

A semiconductor device according to the present invention is characterized in that at least a word line and an earth wire formed in a memory cell are formed of conductive wires which are nearest to one flat surface of a semiconductor substrate, the word line and the earth wire are formed away from each other in a direction parallel to the one flat surface of the semiconductor substrate without crossing each other, and the word line and the earth wire are formed of the same conductive layer.

A semiconductor the present invention is characterized in that an earth wire comprises metal silicide wire.

Further, a semiconductor the present invention is characterized in that an SRAM comprises TFTs as the load devices.

Still further, a semiconductor the present invention is characterized in that the gate electrodes of the driver transistors of said SRAM comprises a single layer of polycrystalline silicon.

Furthermore, a semiconductor device according to the present invention is characterized in that an earth wire which is formed through an insulating film on an active region in a memory cell is used as a gate electrode of an enhancement transistor whose channel region is an active region portion beneath the earth wire.

Still furthermore, a method of manufacturing a semiconductor device according to the present invention is characterized by comprising a first step of forming an insulating film on a semiconductor substrate, a second step of forming a conductive film serving as a word line and an earth wire on the insulating film, and a third step of etching the conductive film using the insulating film as an etching stopper so that the word line and the earth wire are formed without crossing each other.

According to the semiconductor device of the present invention, the word line and the earth wire can be formed substantially in parallel to each other along one flat surface of the semiconductor substrate, and unevenness of the wires such as the word line, the earth wire, etc. can be suppressed, so that the wiring length can be reduced.

According to the semiconductor device of the present invention, the word line and the earth wire are formed of the same material, so that both wiring layers can be simultaneously formed in the same step.

Furthermore, according to the semiconductor device of the present invention, the active region formed in the memory cell can be electrically separated by the enhancement transistor using the earth wire as the gate electrode.

Still furthermore, according to the manufacturing method of the semiconductor device of the present invention, the word line and the earth wire are disposed not to be overlapped with each other, and formed of the same material. Therefore, the word line and the earth wire can be formed at the same time.

DETAILED DESCRIPTION OF THE PREFERRED EMBODIMENTS (Embodiment 1)

An embodiment of the present invention will be described hereunder with reference to FIGS. 1 to 11.

Figure 1:
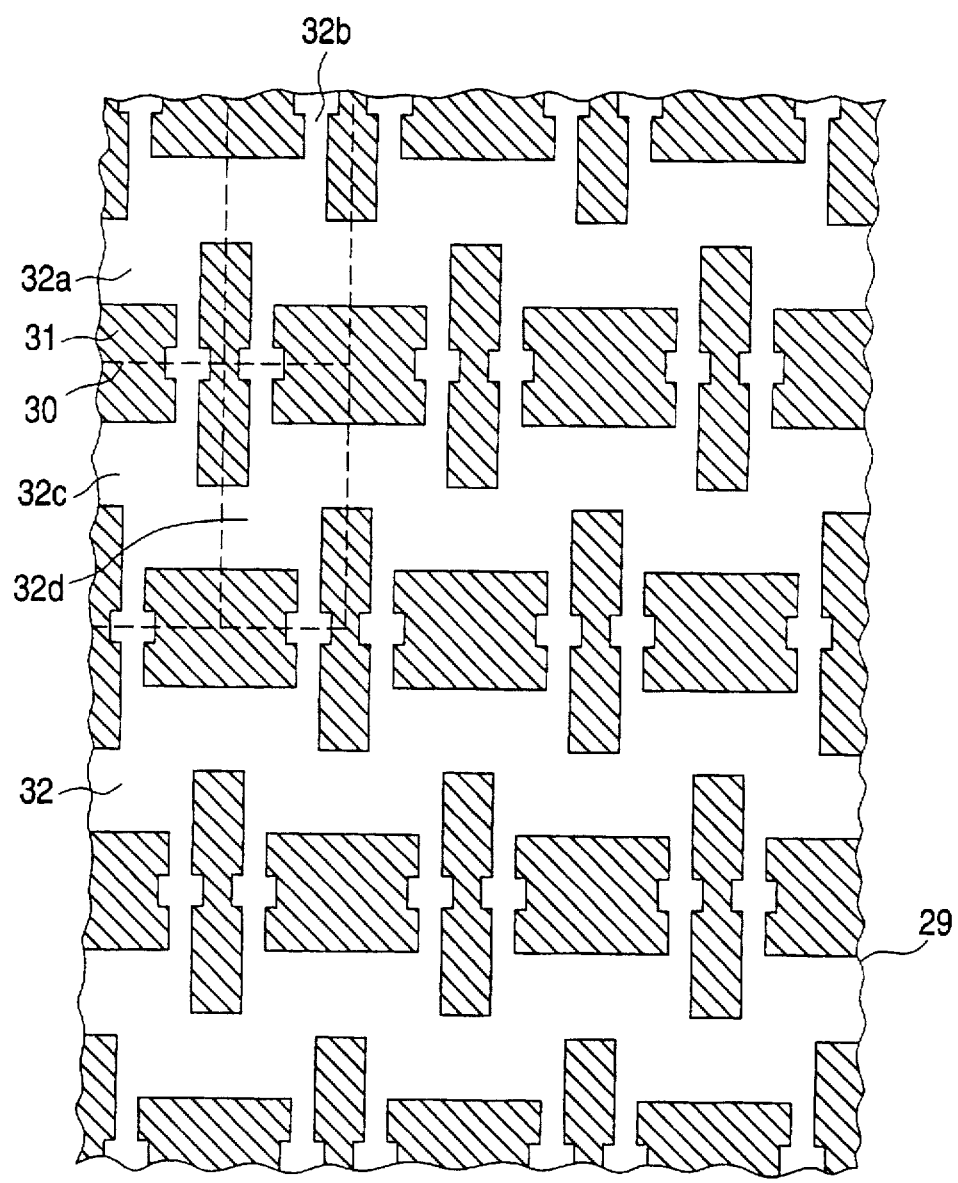
FIG. 1 is a diagram showing a semiconductor device of a first embodiment of the present invention.

In FIG. 1, reference numeral 29 represent a part of a memory cell array formed on a semiconductor substrate, reference numeral 30 represents a memory cell which is lined up on the memory cell array 29, reference numeral 31 represents inactive regions which are formed by a field oxide film, and reference numeral 32 represents active regions which are regions other than the active region as described above. There are four patterns 32a to 32d for the shape of each active region 32, and the active regions are formed by repetitively arranging a combination of four patterns as shown in FIG. 1.

Next, the structure of the SRAM memory cell 30 as described above and a manufacturing method therefor will be described with reference to FIGS. 2 to 11. In these figures, A is a plan view in which the memory cell 30 is viewed from the upper side, B is a cross-sectional view of the memory cell 30 which is taken along a line Y—Y of A.

FIG. 2 is a diagram showing a completed semiconductor device of a first embodiment according to the present invention. As shown in the cross-sectional view of (b), unlike the prior art, an earth wire 42 is formed of the same layer as word lines 43a and 43b which serve as the gate electrodes of access transistors, and conductive films such as a metal silicide film, a polycrystal silicon film, etc. are not formed below the earth wire 42. Therefore, unevenness is small and the effective wiring length of the earth wire 42 is also small. In addition, the semiconductor device is designed so that the earth wire 42 and the conductive region of a P-channel TFT serving as a load element are disposed greatly away from each other. The other detailed structure of the semiconductor device will be described together with the following description on a manufacturing process.

Figure 3A:
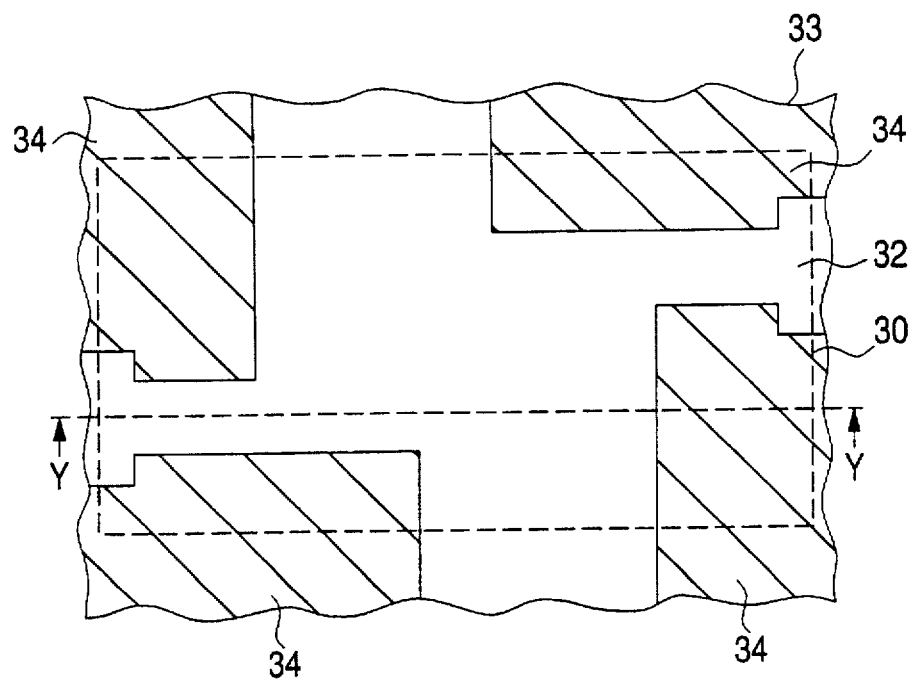
FIGS. 3A and 3B are diagrams showing a manufacturing process of the semiconductor device of the first embodiment of the present invention.
Figure 3B:
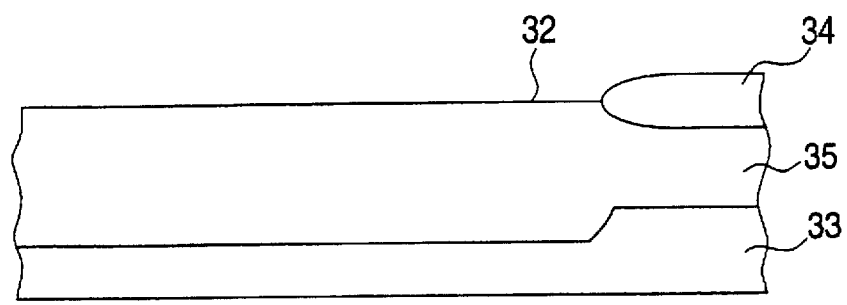

Next, the manufacturing method of the memory cell as described above will be described. First, a field oxide film 34 of silicon dioxide is formed at a thickness of about 4000 angstroms on a semiconductor substrate 33 containing N-type impurities as shown in FIGS. 3A and 3B using a selective thermal oxidation method (for example, LOCOS (Local Oxidation of Silicon) method) using an insulating film such as a silicon dioxide film or the like as a pad film and using a silicon nitride film formed on the insulating film as an oxidation-resistant mask, thereby forming the inactive region 31 (see FIG. 1).

Thereafter, the silicon dioxide film serving as the pad film and the silicon nitride film which are used in the selective thermal oxidation treatment are removed to expose the active region 32 on the semiconductor substrate 33.

Subsequently, P-type impurities of boron (B) or the like are ion-implanted over the whole principle plane of the semiconductor substrate 33 under a condition of about 1.0E12 to 1.0E13 $cm^{-2}$ at 200 to 700 keV to form a P-type well region 35. Subsequently, P-type impurities of boron or the like are further ion-implanted under a condition of about 3.0E12 $cm^{-2}$ at 50 keV to set threshold voltage of access transistors and driver transistors which will be formed in a subsequent process.

Figure 4A:
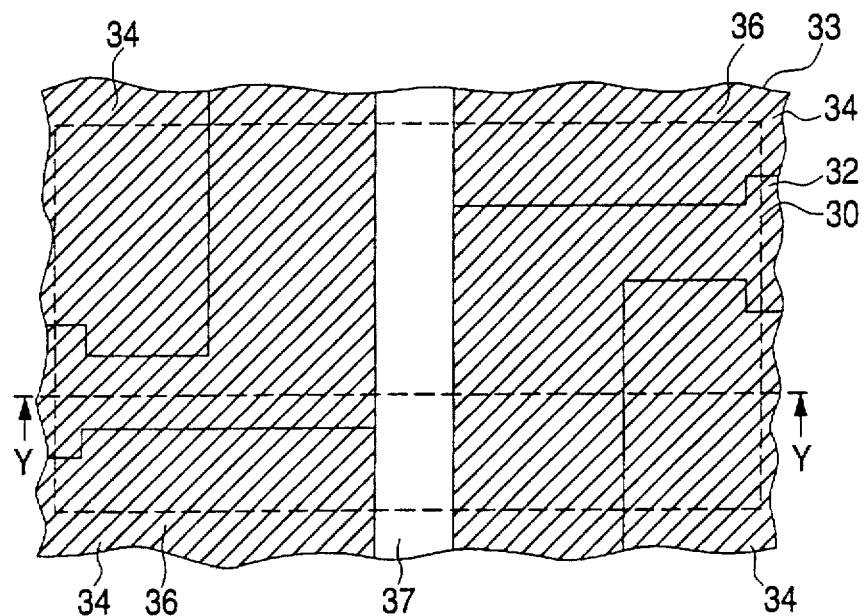
FIGS. 4A and 4B are diagrams showing a manufacturing process of the semiconductor device of the first embodiment of the present invention.
Figure 4B:
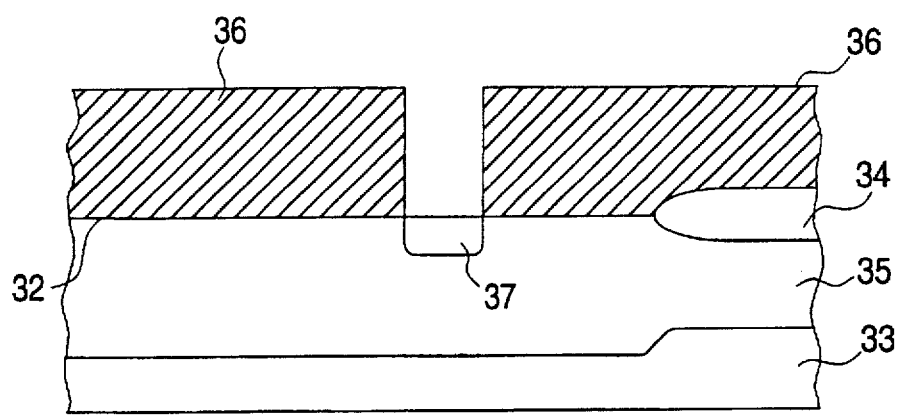

Next, as shown in FIGS. 4A and 4B, a photoresist 36 is patterned using a photolithographic technique so that only a desired portion is exposed, and P-type impurities such as boron or the like are doped using the photoresist as a mask under the following condition: a dose amount of about 2.0E13 $cm^{-2}$ at an ion-implantation intensity of 50 KeV, thereby forming a P-type low-concentration impurity region 37 whose concentration is larger than that of the P-type well region 35 which is formed in the substrate 33. When an MOS transistor is provided in an area containing the P-type low-concentration impurity region 37 by additionally doping the impurities as described above, the threshold voltage thereof can be set to a value larger than those of the access transistors and the driver transistors which are formed in the same cell, that is, than the power source voltage.

Figure 5A:
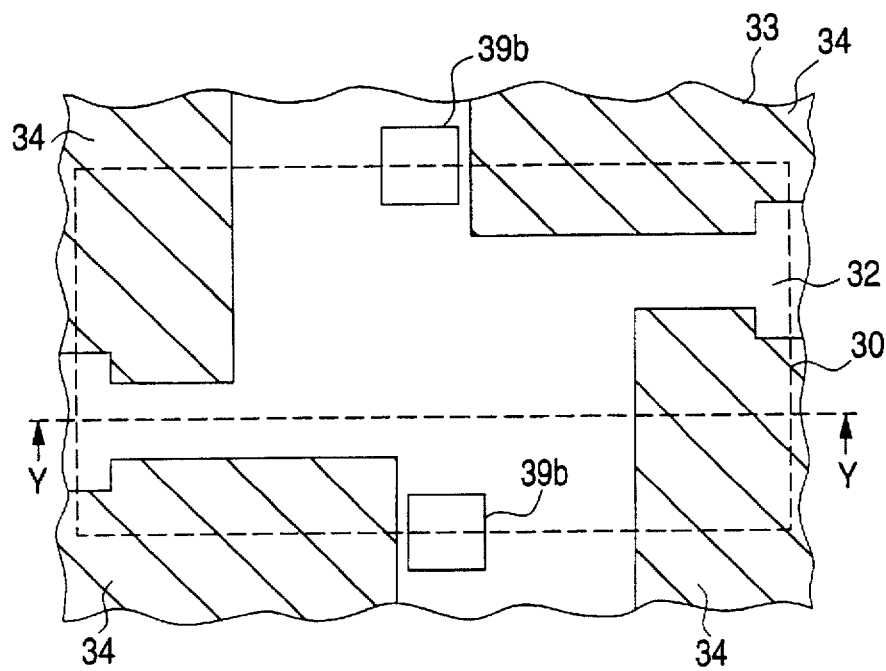
FIGS. 5A to 5C are diagrams showing a manufacturing process of the semiconductor device of the first embodiment of the present invention.
Figure 5B:
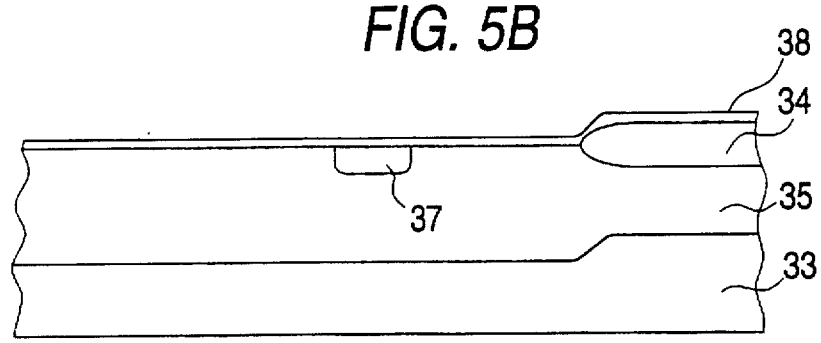
Figure 5C:
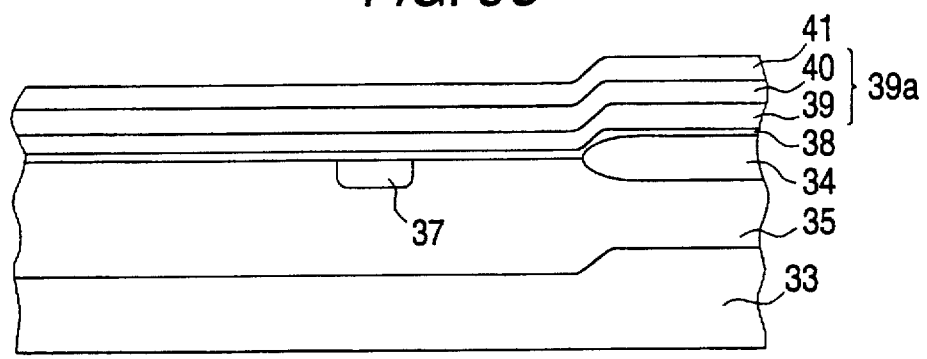

Subsequently, as shown in FIGS. 5A and 5B, a gate oxide film 38 of silicon dioxide is formed at a thickness of about 100 angstroms on the whole surface of the memory cell forming area by thermal oxidation, for example.

Thereafter, a photoresist opening portion is provided at a desired position by the photolithographic technique, and the gate insulation film 38 on the bottom of the resist opening portion is selectively removed with hydrofluoric acid (HF) to form a contact hole 39b.

Next, gas such as phosphine is contaminated using an LPCVD (Low Pressure Chemical Vapor Deposition) method to deposit a phosphorus-doped polycrystal silicon film at a thickness of about 1000 angstroms a phosphorus concentration of about 1.0 to $8.0E20$ cm$^{-3}$, and subsequently a metal silicide film 40 of tungsten silicide or the like is further deposited at a thickness of about 1000 angstroms to form a first conductive film having a two-layer structure in combination with the polycrystal silicon film 39.

Thereafter, a silicon dioxide film 41 is deposited at a thickness of about 1500 angstroms using the LPCVD method.

Figure 6A:
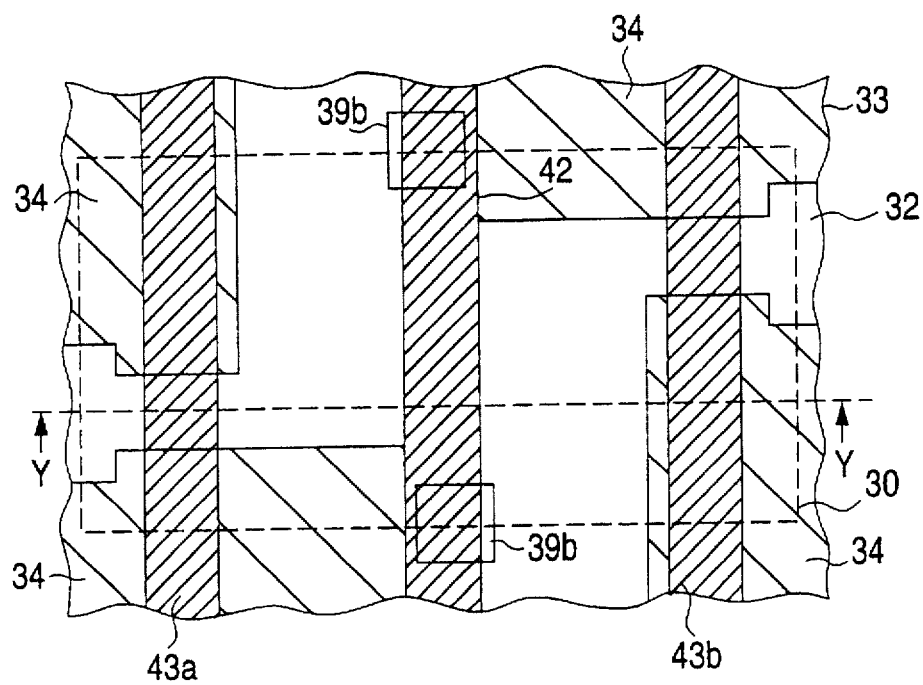
FIGS. 6A and 6B are diagrams showing a manufacturing process of the semiconductor device of the first embodiment of the present invention.
Figure 6B:
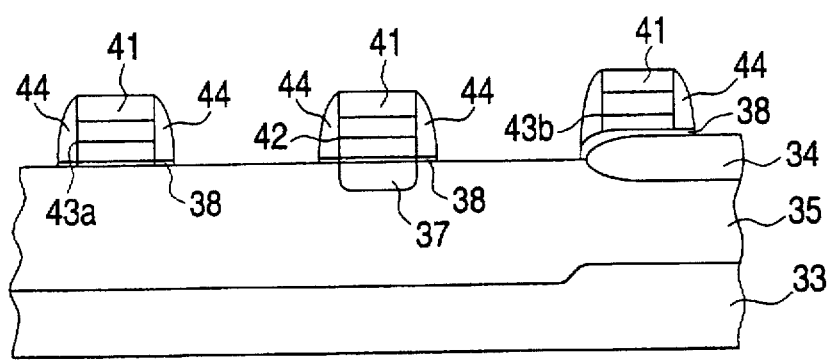

Next, as shown in FIGS. 6A and 6B, a photoresist is patterned into a desired shape by the photolithographic technique, and a reactive ion etching RIE (Reactive Ion Etching) method is applied using the photoresist as a mask to successively subject the silicon dioxide film 41 and the first conductive film 39a to the patterning treatment, thereby forming an earth wire 42 and word lines 43a and 43b. The word lines 43a and 43b serve as gate electrodes of access transistors.

Subsequently, a silicon dioxide film is deposited at a thickness of about 1000 angstroms on the whole surface of the memory cell forming area by the LPCVD method, and then side walls 44 are formed at the side sections of the earth wire 42 and the word lines 43a and 43b as described above by RIE, for example.

Figure 7A:
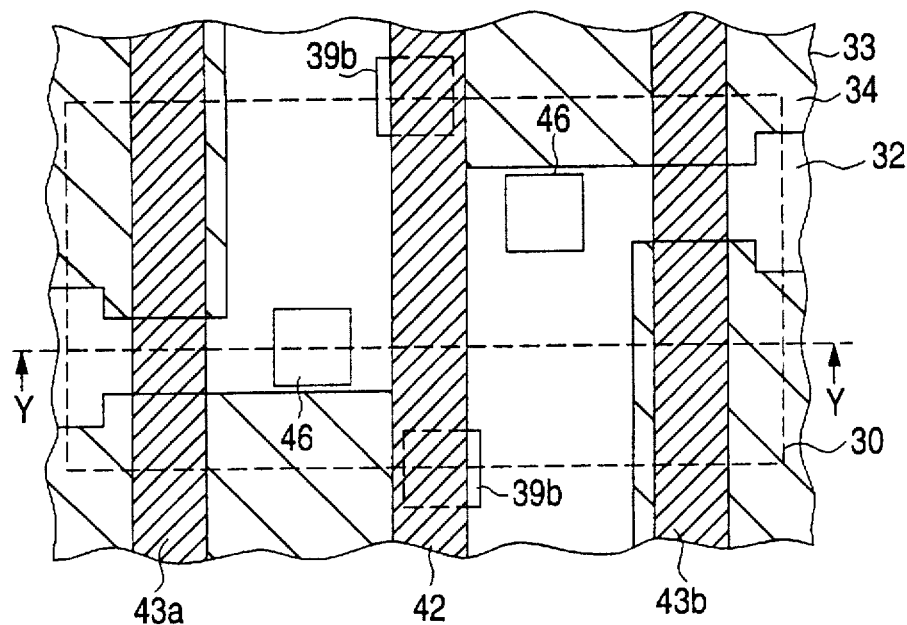
FIGS. 7A and 7B are diagrams showing a manufacturing process of the semiconductor device of the first embodiment of the present invention.
Figure 7B:
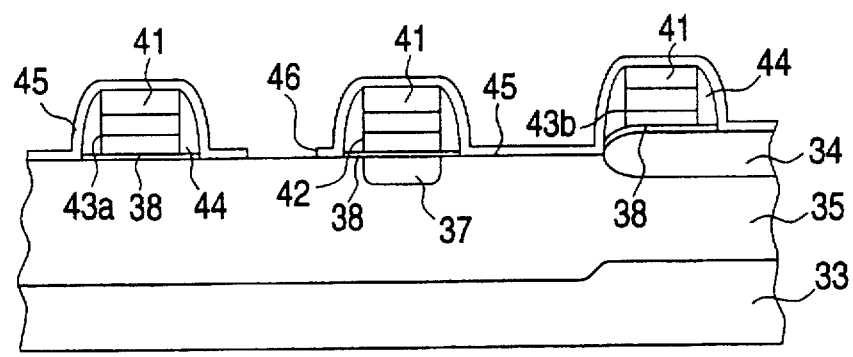

Subsequently, as shown in FIGS. 7A and 7B, a gate oxide film 45 of silicon dioxide is formed at a thickness of about 100 angstroms on the whole surface of the memory cell by the thermal oxidation, for example.

Thereafter, a photoresist opening portion is formed at a desired position by the photolithographic technique, and the gate oxide film 45 at the bottom of the resist opening portion is selectively removed with hydrofluoric acid (HF) to form a contact hole 46.

Figure 8A:
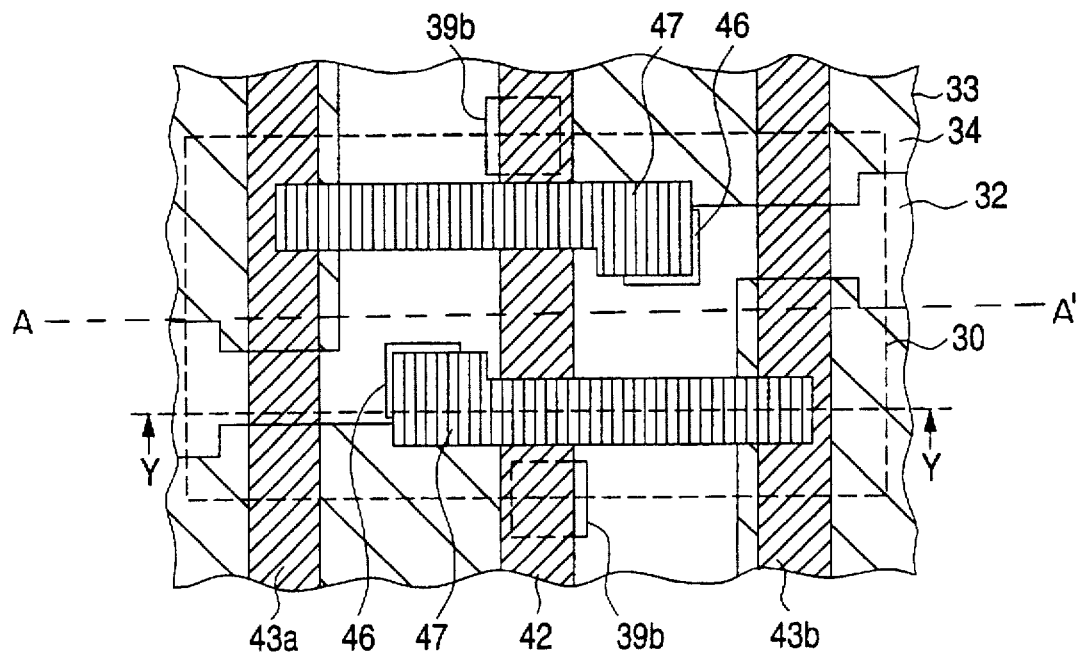
FIGS. 8A to 8D are diagrams showing a manufacturing process of the semiconductor device of the first embodiment of the present invention.
Figure 8B:
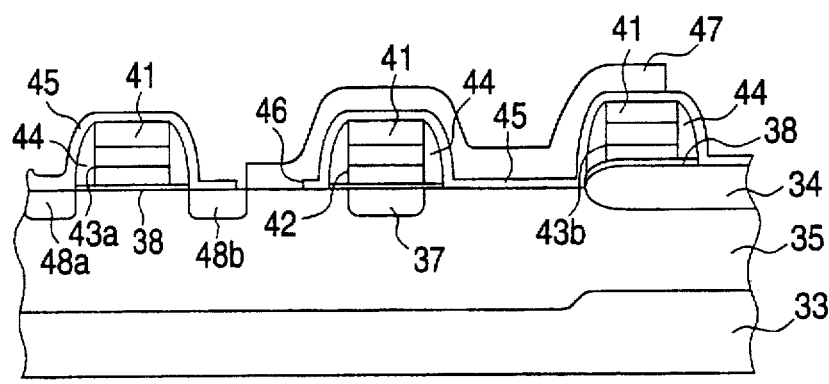

Subsequently, as shown in FIGS. 8A and 8B, a phosphorus-doped polycrystal silicon film is deposited at a thickness of about 1500 angstroms and at a phosphorus concentration of about 1.0 to $8.0E20$ cm$^{-3}$ by the LPCVD method to form a second conductive film. Thereafter, a photoresist is patterned into a desired shape using the photolithographic technique, and the RIE method is applied using the patterned photoresist as a mask to perform the patterning treatment on the second conductive film, thereby forming the gate electrodes 47 of the driver transistors. In the prior art, the gate electrodes of the driver transistors are formed simultaneously with formation of the word lines, so that these are designed in a polycide structure. However, in this case, it is unnecessary to reduce the resistance using the polycide structure because the gate electrodes are not used as paths for column current during a read-out operation, etc., and thus the gate electrodes are merely formed of a phosphorus-doped silicon monolayer. Therefore, the manufacturing process can be more simplified than in the prior art.

Thereafter, phosphorus is doped at a dose amount of 1.0 to $5.0E13$ cm$^{-2}$ at 50 keV using the photoresist as a mask to form a source/drain region 48a, 48b corresponding to an N-type low-concentration impurity region whose phosphorus concentration is equal to about $10^{17}$ to $10^{18}$/cm$^3$.

Figure 8C:
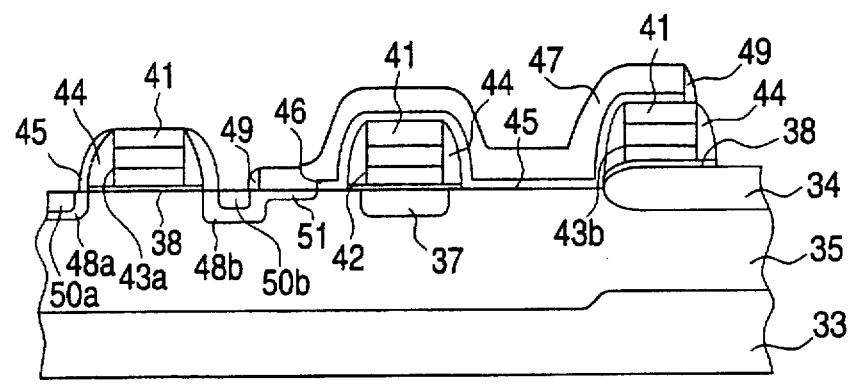

Next, as shown in FIG. 8C, the photoresist film as described above is removed, then a silicon dioxide film is deposited at a thickness of about 1500 angstroms on the whole surface of the memory cell by the LPCVD method, and then side walls 49 are formed on the side sections of the gate electrode 47 by RIE, for example.

Figure 8D:
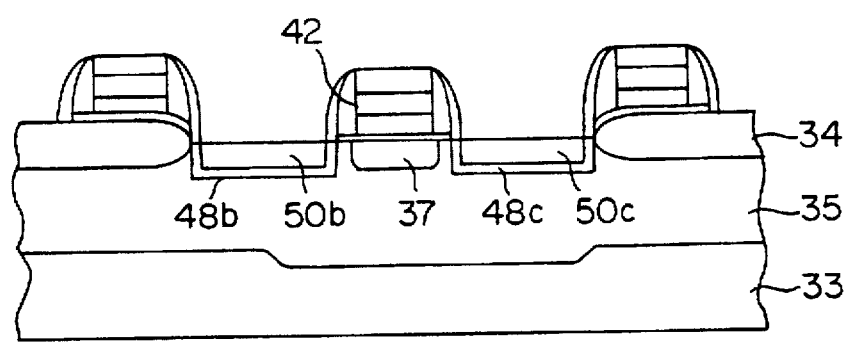

FIG. 8D is a sectional view taken along line A—A' of FIG. 8A. A gate electrode 42 is biased to the zero voltage, since a gate electrode 42 is a GND line. Reference numerals 48b and 50b and reference numerals 40c and 50c represent source/drain regions.

Thereafter, for example arsenic (As) is doped over the whole surface at a dose amount of 1.0 to $5.0E15$ cm$^{-2}$ at 50 keV to form a source/drain region 50a, 50b having an impurity concentration of about $10^{20}$/cm$^3$.

A source/drain region having a so-called LDD structure can be formed by forming the source/drain region 48a, 48b serving as the N-type low-concentration impurity region and the source/drain region 50a, 50b serving as the N-type high-concentration impurity region as described above.

Thereafter, a thermal treatment is performed at a temperature of 850° C. for about 30 minutes to activate the impurities in the source/drain region 50a, 50b serving as the N-type high-concentration impurity region.

At this time, a part of phosphorus which is contained in the gate electrode 47 diffuses from the gate electrode 47 through the contact hole 47 into the P-type well region 35 to form an N-type high-concentration impurity diffusion layer 51.

As a result, the gate electrode 47 of the driver transistor and the source/drain region 50b are connected to each other through the N-type high-concentration impurity diffusion layer 51 and the source/drain region 48b which is the N-type low-concentration impurity region.

Figure 9A:
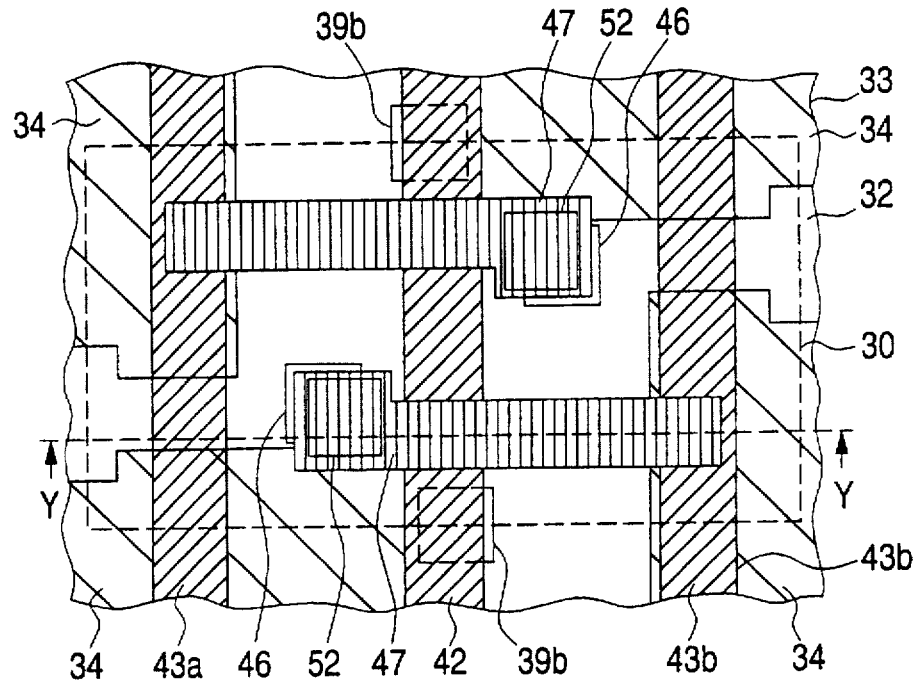
FIGS. 9A and 9B are diagrams showing a manufacturing process of the semiconductor device of the first embodiment of the present invention.
Figure 9B:
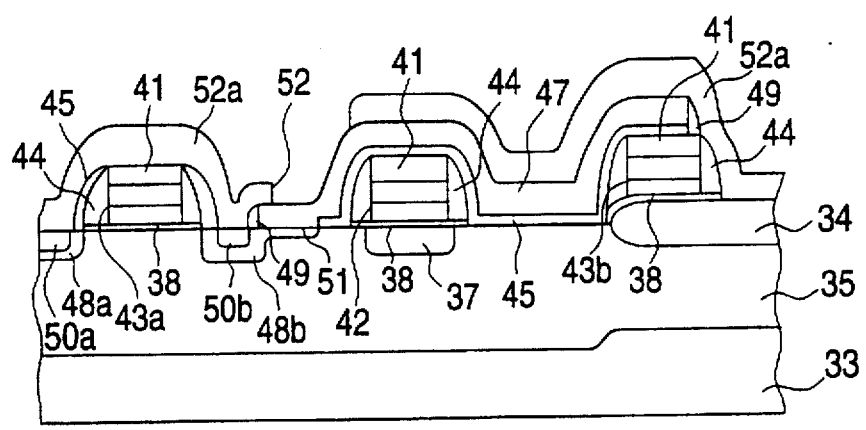

Subsequently, as shown in FIGS. 9A and 9B, a silicon dioxide film is deposited at a thickness of about 1500 angstroms on the whole surface of the memory cell forming area by the LPCVD method, and then a photoresist is patterned into a desired shape using the photolithographic technique. Thereafter, the RIE method is applied using the patterned photoresist as a mask to selectively remove the silicon dioxide film, thereby forming contact holes 52 in which parts of the gate electrodes 47 of the driver transistors are exposed to the contact holes.

Figure 10A:
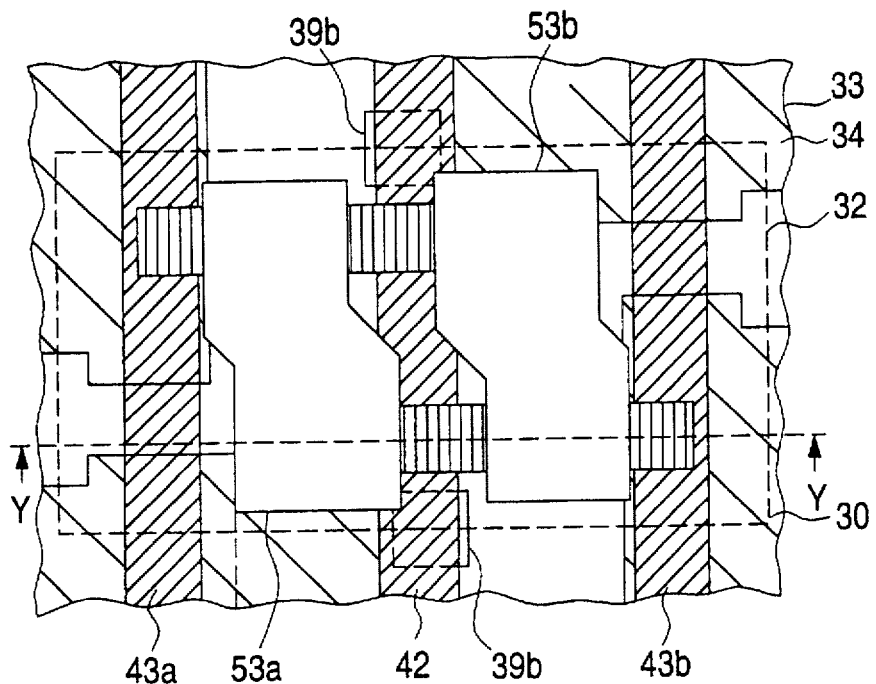
FIGS. 10A and 10B are diagrams showing a manufacturing process of the semiconductor device of the first embodiment of the present invention.
Figure 10B:
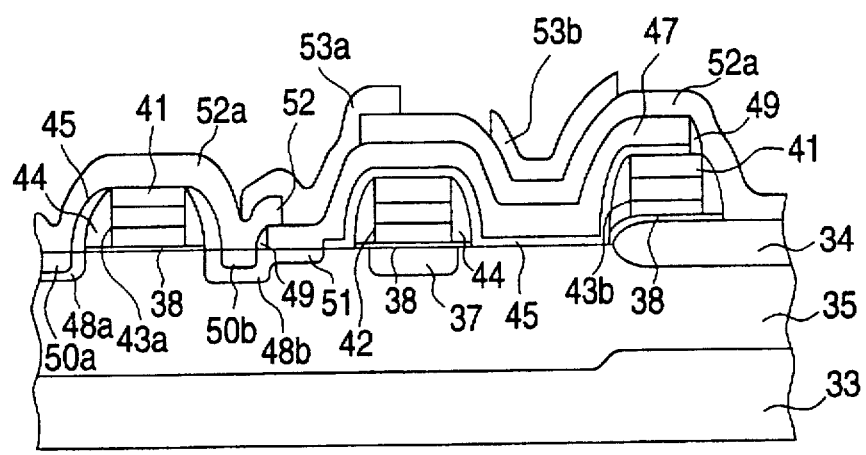

Subsequently, as shown in FIGS. 10A and 10B, a phosphorus-doped polycrystal silicon film is deposited at a thickness of about 1000 angstroms and a phosphorus concentration of about 1.0 to $8.0E20$ cm$^{-3}$ on the whole surface of the memory cell forming area by the LPCVD method. Thereafter, a photoresist is patterned into a desired shape using the photolighographic technique, and the RIE method is applied using the patterned photoresist as a mask to perform the patterning treatment on the phosphorus-doped polycrystal silicon film, thereby forming gate electrodes 53a and 53b of P-channel type TFTs.

Figure 11A:
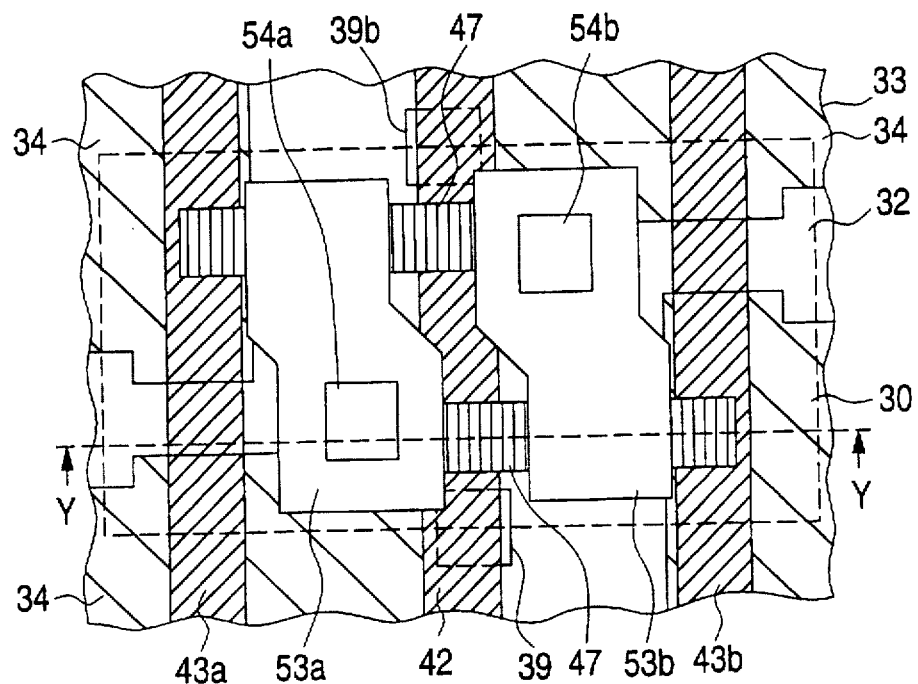
FIGS. 11A and 11B are diagrams showing a manufacturing process of the semiconductor device of the first embodiment of the present invention.
Figure 11B:
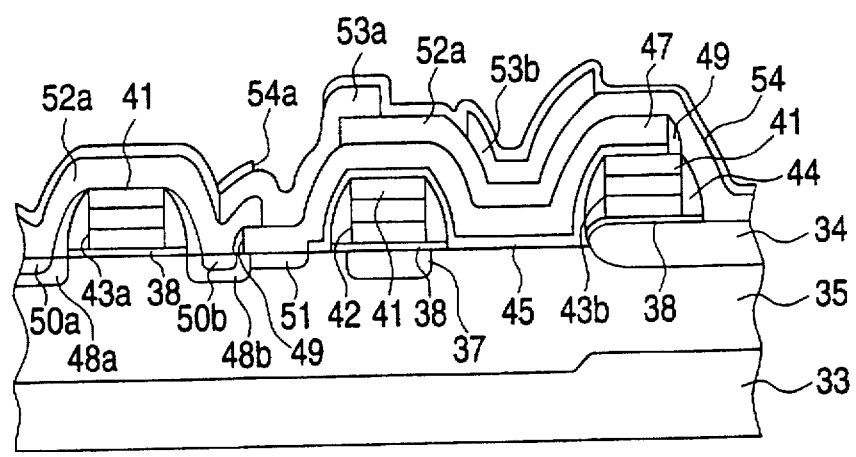

Subsequently, as shown in FIGS. 11A and 11B, an insulation film 54 of silicon dioxide is deposited on the whole surface of the memory cell area at a thickness of about 300 angstroms by the LPCVD method, and then a photoresist is patterned into a desired shape. The RIE method is applied using the patterned photoresist as a mask to selectively remove the insulation film 54, thereby forming contact holes 54a and 54b in which parts of the gate electrodes 53a and 53b of the P-channel type TFTs are exposed to the contact holes.

Figure 2A:
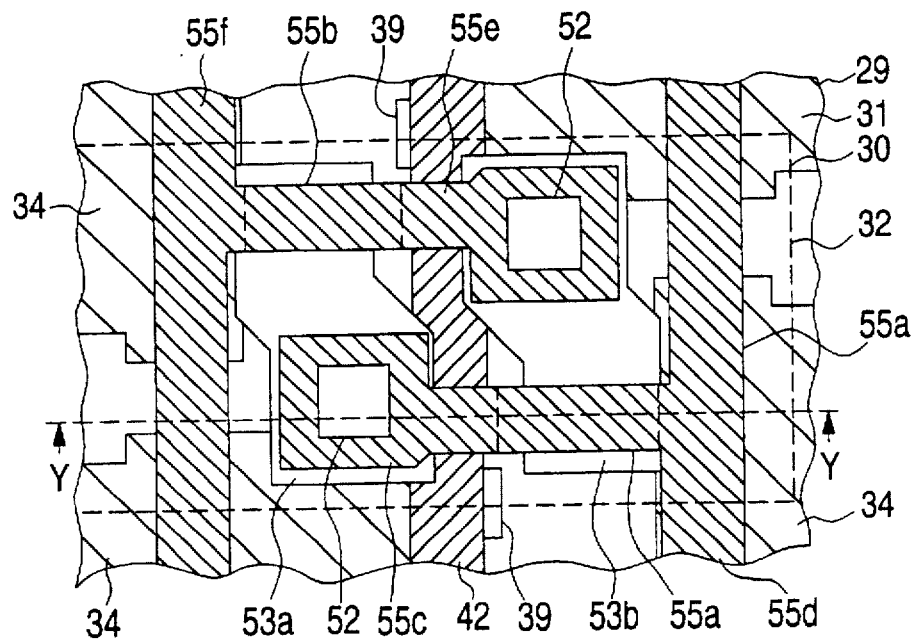
FIGS. 2A and 2B are diagrams showing a manufacturing process of the semiconductor device of the first embodiment of the present invention.
Figure 2B:
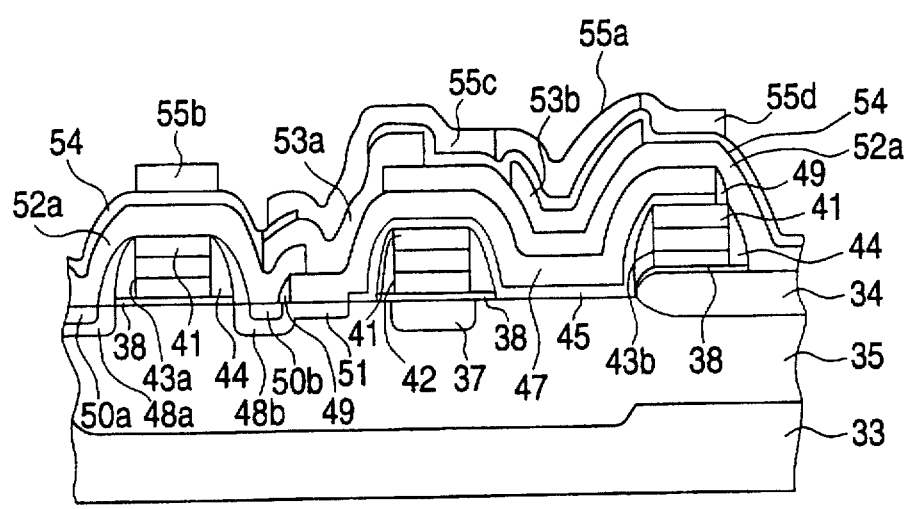

Subsequently, as shown in FIGS. 2A and 2B, a polycrystal silicion film is deposited at a thickness of about 500 angstroms on the whole surface of the memory cell forming area using the LPCVD method, and a photoresist is patterned into a desired shape using the photolithographic technique. The RIE method is applied using the patterned photoresist as a mask and the patterning treatment is performed on the polycrystal silicon film to form conductive regions 55a and 55b which will be the source/drain region and the channel region of the P-channel type TFT. Thereafter, the photoresist is patterned into a desired shape using a photolithographic technique, and a source/drain region 55c to 55f which comprises the P-type high-concentration impurity regions is formed in a desired region of the conductive regions 55a and 55b of the P-channel type TFT using the patterned photoresist as a mask.

Thereafter, like an ordinary LSI, there are steps of forming a contact hole so as to be contacted with an active region (the source/drain regions 48a, 50a in this embodiment), forming an aluminum wire (bit line) so as to be contacted with the contact, etc., and the description of these steps is omitted to simplify the description.

The memory cell of the SRAM shown in FIG. 2 can be formed through the process as described above.

In the memory cell of the semiconductor device thus formed, the earth wire 42 and the word lines 43a, 43b are formed so as to be in parallel to each other along one flat surface of the semiconductor substrate 33 and so as to be away from the flat surface of the semiconductor substrate 33 at a predetermined distance. Therefore, the earth wire 42 and the word lines 43a, 43b which are formed on different layers in the prior art can be formed of the same conductive film (first conductive film 39a) at the same time, so that low-resistance wires comprising a metal silicide film and a polycrystal silicon film can be formed without increasing the number of steps. Furthermore, the gate oxide film 38 of about 100 angstroms in thickness is formed between the earth wire 42 and the semiconductor substrate 33, and the surface of the oxide film is flat like the surface of the semiconductor substrate 33, so that increases of the wiring length of the earth wire formed on the oxide film can be suppressed. The reduction in the wiring length enables reduction in wiring resistance, thereby suppressing the malfunction which is caused by rise-up of the potential of the earth wire from a predetermined potential when the earth wire has large resistance, which is a problem occurring in the read-out operation. In addition, when the P-channel type TFT is formed as a load element, the prior art has a problem that malfunction occurs because the earth wire and the channel region of TFT are near to each other. However, in this embodiment, the channel region of the TFT and the earth wire are disposed away from each other at a large distance, so that there occurs no problem of malfunction due to the parasitic gate electrode.

Furthermore, since the earth wire 42 is formed of the first conductive film 39a wire is a conductive film of the lowermost layer, the earth wire 42 is not required to be designed in such a bent shape that it bypasses the contact. This shape has been required in the prior art. Therefore, the wiring width of the earth wire 42 is small, and thus the increase of the wiring resistance can be suppressed.

Still furthermore, the word lines 43a and 43b and the gate electrode 47 of the driver transistor which are formed at the same time in the prior art are formed of different conductive layer films at different timings, so that the word lines and the gate electrode can be designed to be partially overlapped with each other through the insulating film in a vertical direction. Therefore, the size of the memory cell can be reduced in the gate width direction of the gate electrode of the driver transistor, and thus the integration degree can be improved.

In addition, the P-type low-concentration impurity region is formed inside the semiconductor substrate which is below the earth wire 42, so that a non-conductive N-channel MOS transistor using the earth wire 42 as a gate electrode can be formed. With this N-channel MOS transistor, the sequential active region 32 can be separated into two regions. Therefore, unlike the prior art, no field oxide film is required to separate the active region, and the patterning of the active region can be facilitated.

(Embodiment 2)

Another embodiment of the present invention will be described with reference to FIGS. 12 to 16.

Figure 12A:
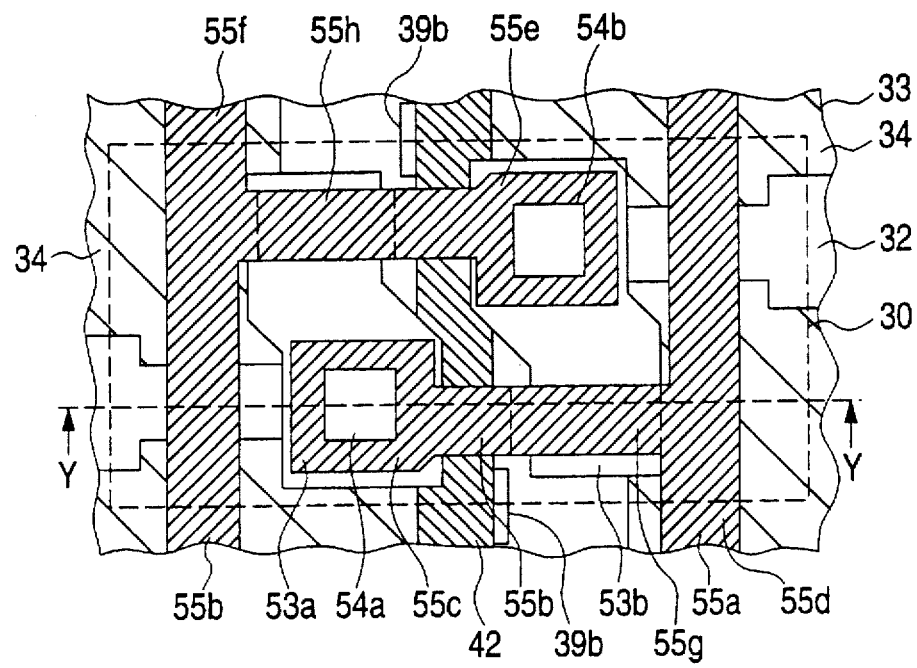
FIGS. 12A and 12B are diagrams showing a semiconductor device of a second embodiment of the present invention.
Figure 12B:
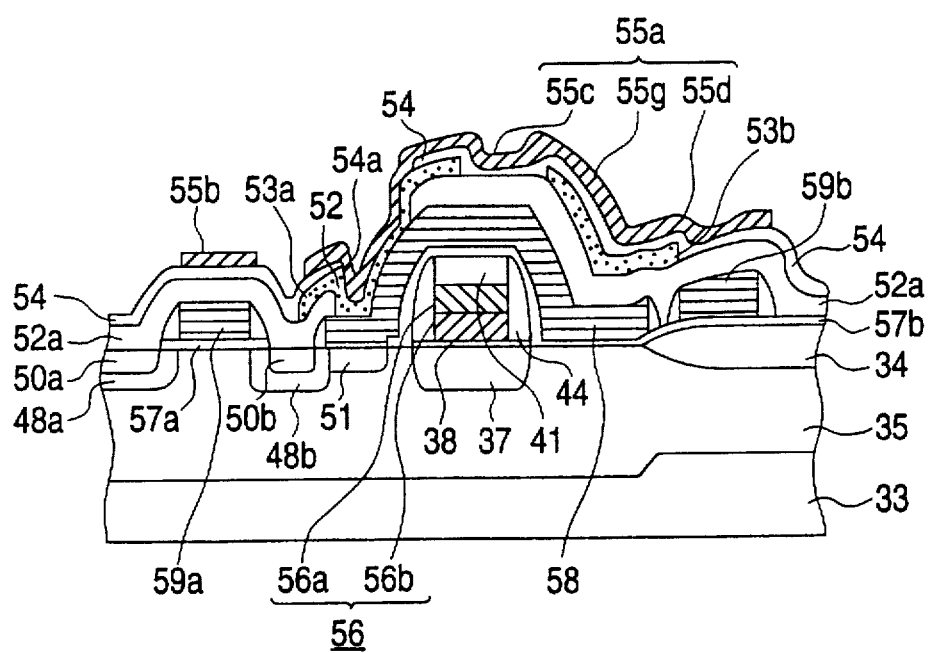

FIGS. 12A and 12B are diagrams showing a completed semiconductor device of the second embodiment. In these figures, the same reference numerals as the embodiment 1 represent the same or corresponding elements. The different points between this invention and the embodiment 1 resides in that in the embodiment 1, the word lines are formed simultaneously with formation of the earth wire, whereas in this invention only an earth wire 56 is formed, and then word lines 59a, 59b each comprising a monolayer of polycrystal silicon are formed. The other detailed construction of the semiconductor device will be described hereunder together with the description on the manufacturing process.

As shown in FIG. 12, the earth wire 56 and the word lines 59a, 59b are arranged so that these are not formed on the other wires, there is little unevenness in the word line, and the wiring resistance is more reduced than the case that the word line is formed on the earth line in the underlayer, whereby the transferring delay of the word line is reduced.

Figure 13A:
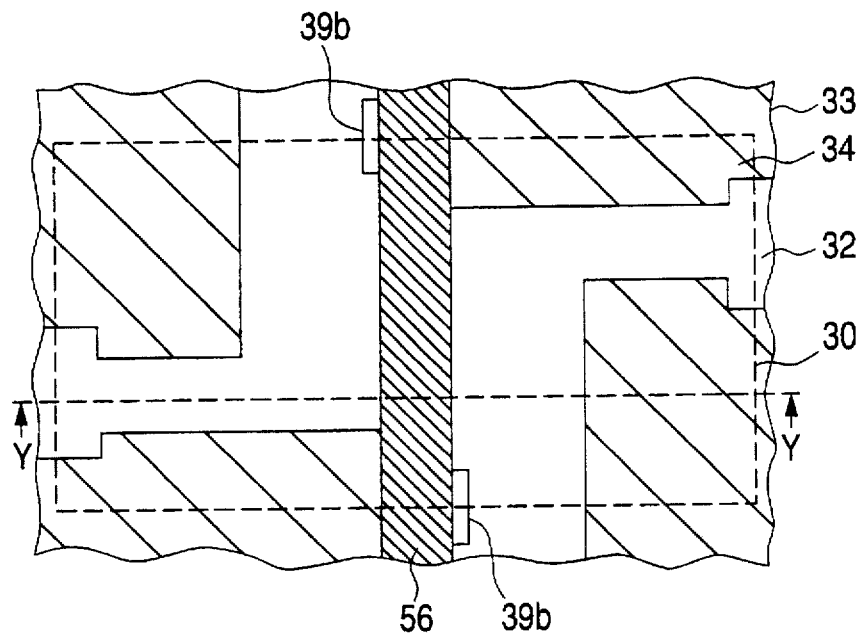
FIGS. 13A and 13B are diagrams showing a manufacturing process of the semiconductor device of the second embodiment of the present invention.
Figure 13B:
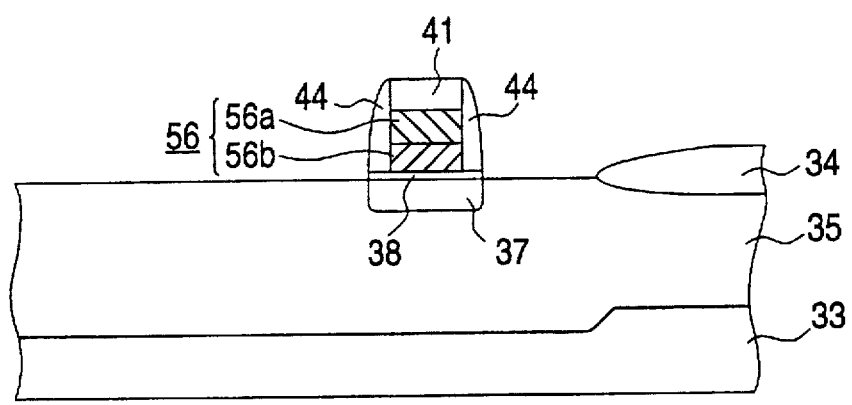

Next, a method of manufacturing the semiconductor device of the second embodiment will be described in step order with reference to FIGS. 13 to 16. Like the embodiment 1, as shown in FIGS. 13A and 13B, an inactive region 34 comprising a field oxide film of about 4000 angstroms in thickness is first formed on a semiconductor substrate 1 containing N-type impurities, and subsequently a P-type well region 37 and a gate oxide film 38 are formed in this order. Thereafter, a photoresist opening portion is provided at a desired position by the photolithographic technique, and the gate oxide film 38 at the bottom of the resist opening portion is selectively removed to form a contact hole 39b. Thereafter, like the embodiment 1, an earth wire 56 comprising two conductive film of a conductive film 56b formed of polycrystal silicon film and a conductive film 56a formed of metal silicide film, are formed.

Figure 14A:
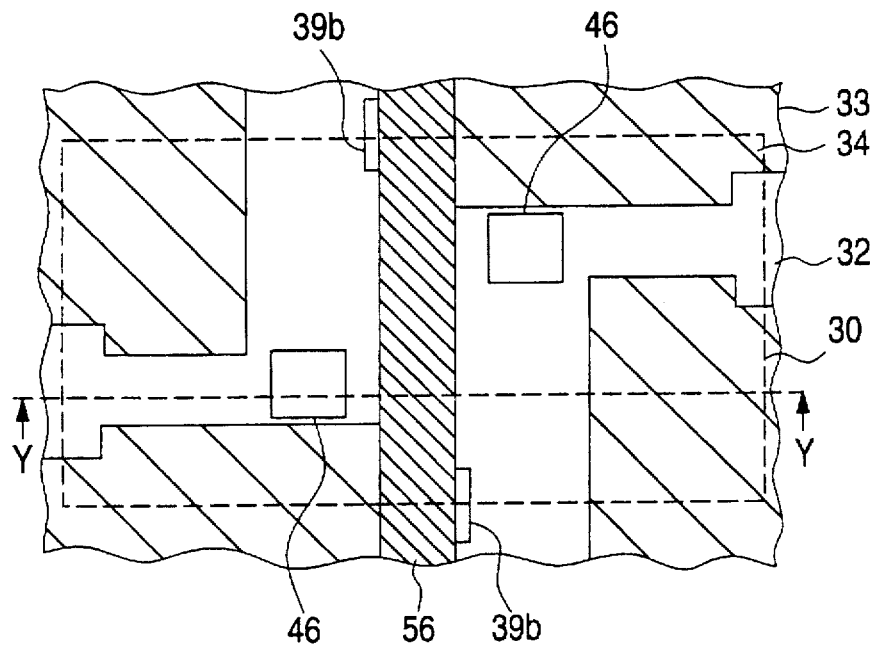
FIGS. 14A and 14B are diagrams showing a manufacturing process of the semiconductor device of the second embodiment of the present invention.
Figure 14B:
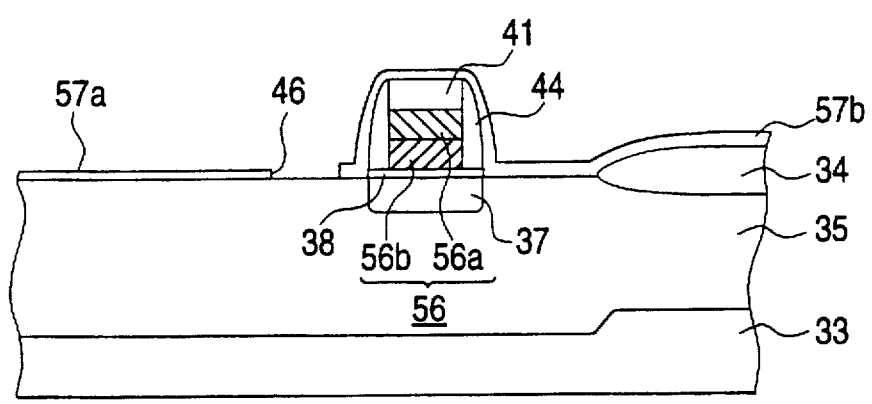

Subsequently, as shown in FIGS. 14A and 14B, gate oxide films 57a, 57b of silicon dioxide are formed at a thickness of about 100 angstroms on the whole surface by a thermal oxidation method or the like, and then a photoresist opening portion is formed at a desired position by the photolithographic technique. The gate oxide films 57a and 57b at the bottom of the resist opening portion are selectively removed with hydrofluoric acid or the like to form a contact hole 46.

Figure 15A:
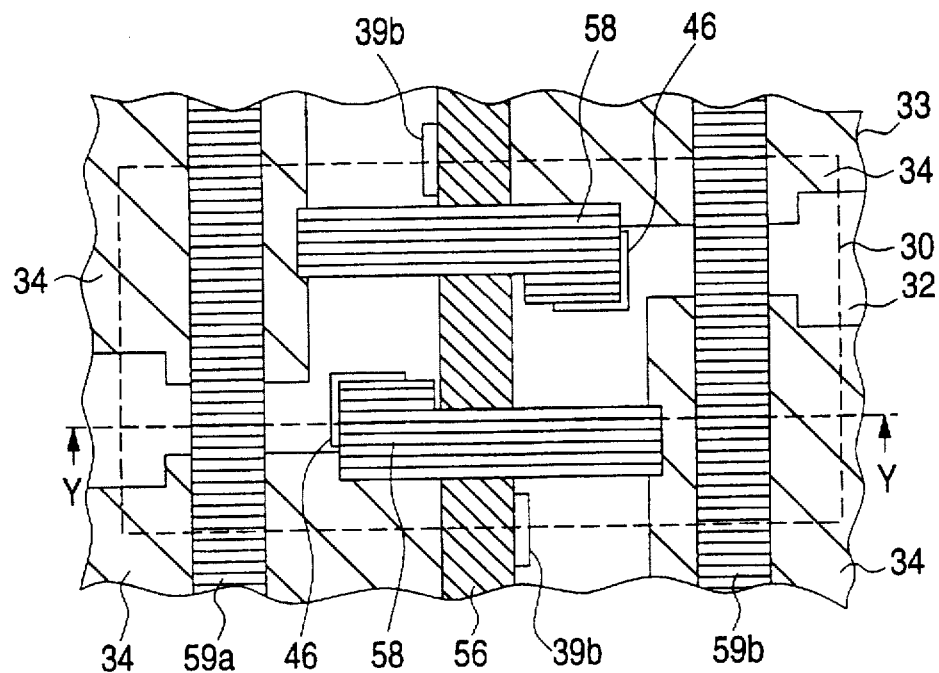
FIGS. 15A and 15B are diagrams showing a manufacturing process of the semiconductor device of the second embodiment of the present invention.
Figure 15B:
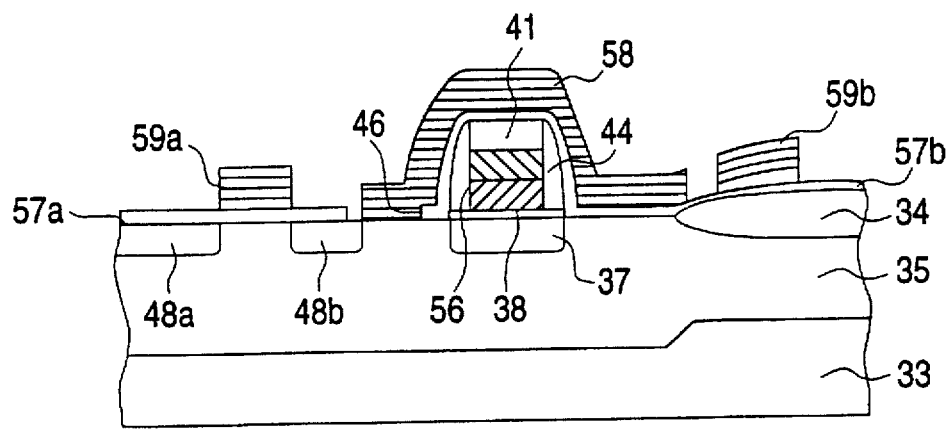

Subsequently, as shown in FIGS. 15A and 15B, a phosphorus-doped polycrystal silicon film having a phosphorus concentration of about 1.0 to $8.0 \text{E} 20 \text{ cm}^{-3}$ is deposited at a thickness of about 1500 angstroms by the LPCVD method, and then the patterning treatment is conducted to form the word lines 59a, 59b and the gate electrode 58 of the driver transistor. Thereafter, phosphorus (P) is doped at a dose amount of about 1.0 to 5.0E13 cm$^{-3}$ at 50 keV using the photoresist as described above as a mask to form source/drain regions 48a and 48b of phosphorus concentration of about $10^{17}$ to $10^{18}$/cm$^3$ which are N-type low-concentration impurity regions. As a result, as is apparent from FIG. 15A, like the embodiment 1, the word lines 59a and 59b and the earth wire 56 are arranged in parallel to one flat surface of the semiconductor substrate 33 so that these lines are not overlapped with each other.

Figure 16A:
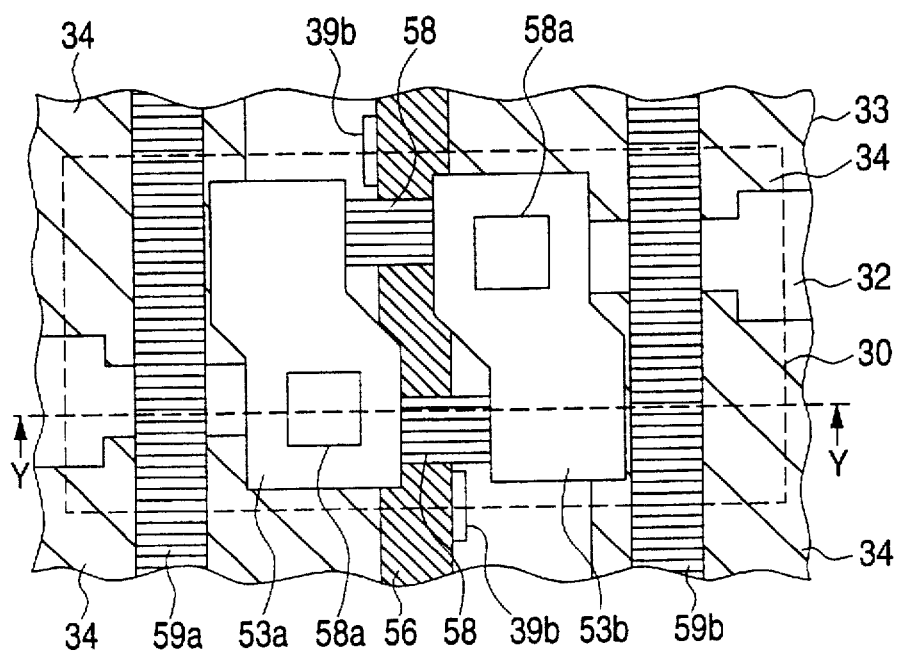
FIGS. 16A and 16B are diagrams showing a manufacturing process of the semiconductor device of the second embodiment of the present invention.
Figure 16B:
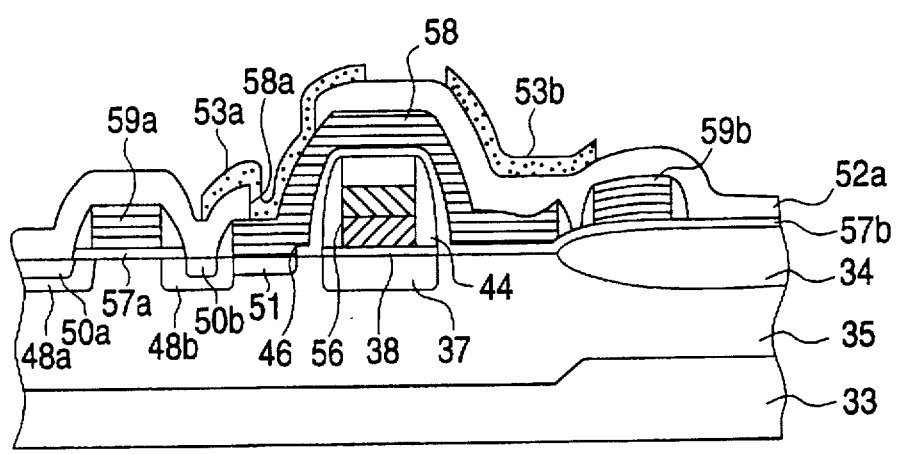

Subsequently, as shown in FIGS. 16A and 16B, after the photoresist film is removed, a silicion dioxide film of about 1500 angstroms is deposited on the whole surface of the memory cell forming area by the LPCVD method, and then an etching treatment is conducted using the RIE method so that side walls remain on the side sections of the wire layers of the gate electrodes 59a and 59b. Thereafter, arsenic (AS) is doped at a dose amount of 1.0 to 5.0E15 cm$^{-2}$ at 50 keV to form source drain regions 50a and 50b of arsenic concentration of about $10^{20}$/cm$^3$ which are N-type high-concentration impurity regions. Accordingly, the source/drain regions can be designed in an LDD structure in which electric field in the neighborhood of the drain region can be moderated by the N-type high-concentration impurity regions 50a and 50b and the N-type low-concentration impurity regions 48a and 48b.

Thereafter, a thermal treatment is conducted at a temperature of 850° C. for about 30 minutes to activate the impurities contained in the source/drain regions 50a and 50b which comprise the N-type high-concentration impurity regions as described above. At this time, the impurities contained in the gate electrode 58 of the driver transistor diffuse onto the surface of the semiconductor substrate 33 through the contact hole 46 to form an N-type high-concentration impurity region 51. By forming the N-type high-concentration impurity region 51 as described above, the gate electrode 58 of the driver transistor and the N-type high-concentration impurity region 50b of the source/drain region of the access transistor are connected to each other through the N-type low-concentration impurity region 48b.

Subsequently, like the embodiment 1, a silicon dioxide film of about 1500 angstroms in thickness is deposited on the whole surface of the memory cell forming area by the LPCVD method, and then a photoresist is patterned in a desired shape using the photolithographic technique. Thereafter, the silicon dioxide film is selectively removed using the patterned photoresist as a mask by the RIE method or the like to form contact holes 58a so that parts of the gate electrodes 58 of the driver transistors are exposed to the contact holes. Thereafter, a phosphorus-doped polycrystal silicon film which has a phosphorus concentration of about 1.0 to 8.0E20 cm$^{-3}$ and a thickness of about 1000 angstroms is subjected to the patterning treatment to form the gate electrodes 53a and 53b of the P-channel type TFT.

Subsequently, as shown in FIGS. 12A and 12B, a silicon dioxide of about 300 angstroms in thickness is deposited on the whole surface of the memory cell forming area by the LPCVD method. Thereafter, a photoresist is patterned in a desired shape using the photolithographic technique, and the silicon dioxide film is selectively removed using the patterned photoresist as a mask by applying the RIE method to form contact holes 54a and 54b so that parts of the gate electrodes 53a and 53b of the P-channel type TFT serving as load elements are exposed to the contact holes.

Subsequently, a polycrystal silicion film of about 500 angstroms in thickness is deposited by the LPCVD method, and a photoresist is patterned in a desired shape by the photolithographic technique. The polycrystal silicon film as described above in subjected to the patterning treatment using the patterned photoresist as a mask by the RIE method to form conductive regions 55a and 55b which will become a channel region and a source/drain region of the P channel type TFTs.

Thereafter, a photoresist film is patterned in a desired shape by the photolithographic technique, and then conductive regions 55a to 55f serving as a P-type high-concentration impurity region are formed at a prescribed area of the conductive regions 55a and 55b of the P-channel type TFTs using the patterned photoresist as a mask. With this treatment, the a conductive layer between the source/drain regions 55c and 55d becomes a channel region 55g, and likewise a conductive layer between the source/drain regions 55e and 55f becomes a channel region 55h.

Thereafter, like an ordinary memory cell, a layer-insulation film and a contact hole aluminum wire (bit line) are formed. This process is performed in the same manner as the prior art, and thus the description thereof is omitted.

As described above, in the embodiment 2, the word lines 59a and 59b and the gate electrode 58 of the driver transistor are simultaneously formed of the conductive layer which is formed as a second layer as shown in FIG. 15. As described above, there is little unevenness in the underlayer of the earth wire 56 even when the memory cell is formed. Therefore, like the embodiment 1, the wiring length of the earth wire 56 can be reduced, and thus the wiring resistance can be reduced more than that in the prior art. In addition, the earth wire 56 and the conductive regions 55a and 55b corresponding to the source/drain region and the channel region of the P-channel type TFT which is a load element are disposed away from each other at a longer distance than that of the prior art, so that it can be prevented that the earth wire 56 acts as a parasitic gate electrode and thus the transistor is conducted due to its malfunction.

(Embodiment 3)

Another embodiment of the present invention will be described with reference to FIGS. 17 to 23.

Figure 17A:
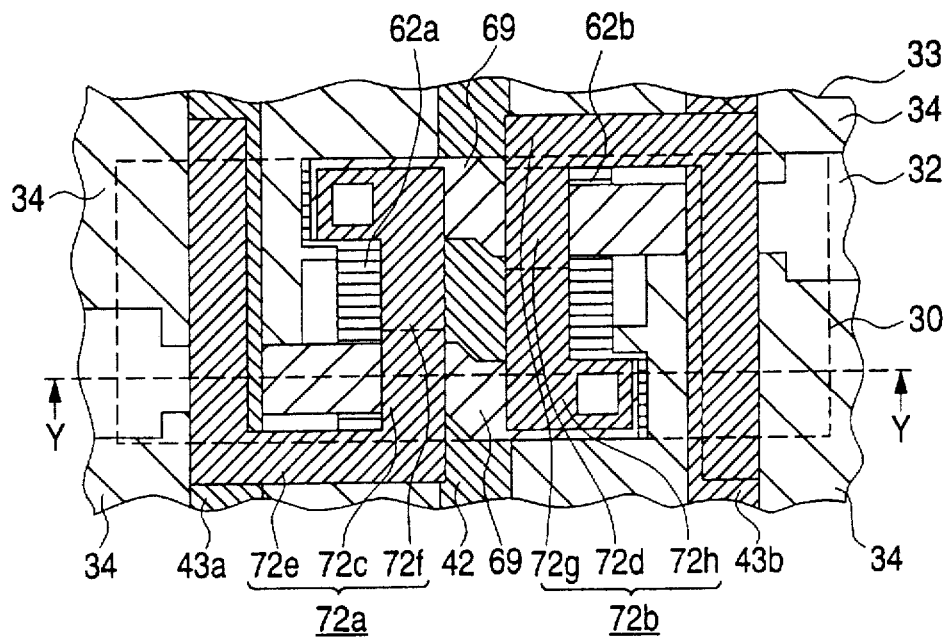
FIGS. 17A and 17B are diagrams showing a semiconductor device of a third embodiment of the present invention.
Figure 17B:
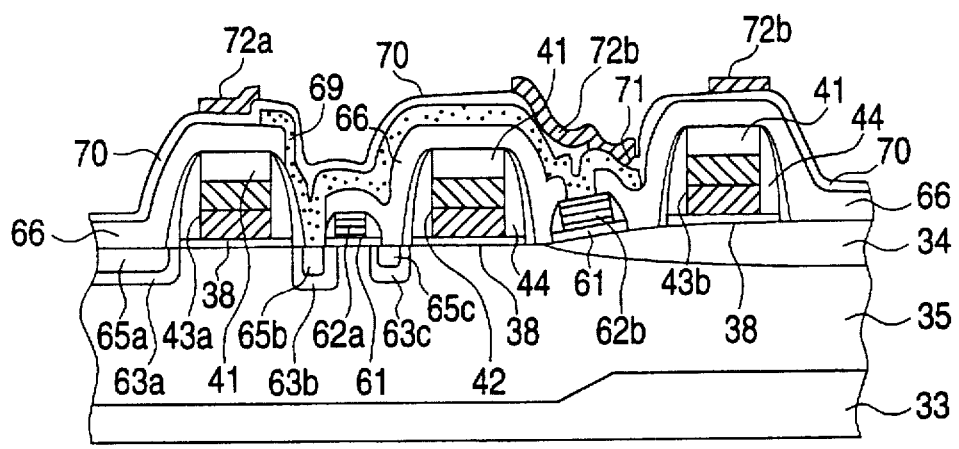

FIGS. 17A and 17B are diagrams showing a completed semiconductor device of the third embodiment. In these figures, the same reference numerals as the embodiment 1 and the embodiment 2 represent the same or corresponding elements. The different point between this invention and the embodiment 1 resides in that in the embodiment 1 the gate electrodes 47 of the driver transistors are arranged in a perpendicular direction to an extending direction of the earth wire 42 and the word lines 43a and 43b as shown in FIG. 8A, whereas in this embodiment the gate electrode 69 of the driver transistor is arranged substantially in parallel to and along the extending direction of the word lines 42 and the earth wires 43a and 43b.

Figure 18A:
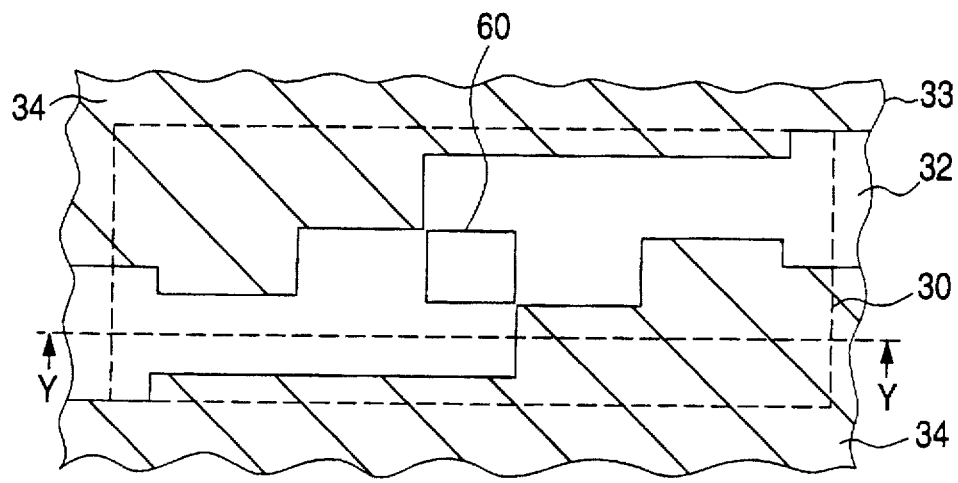
FIGS. 18A and 18B are diagrams showing a manufacturing process of the semiconductor device of the third embodiment of the present invention.
Figure 18B:
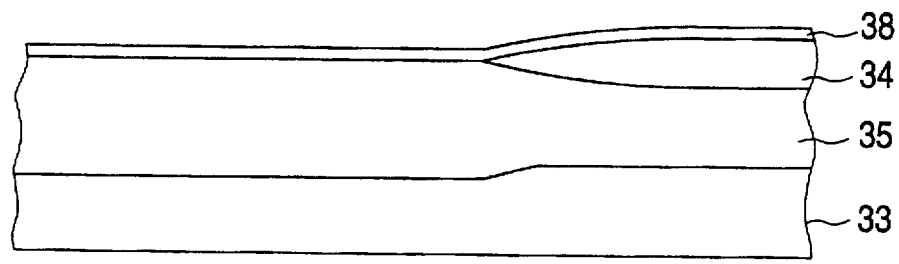

Next, a method of manufacturing the semiconductor device shown in FIG. 17 will be described. As shown in FIGS. 18A and 18B, like the first embodiment, a field oxide film 34 of about 4000 angstroms in thickness is first formed on a semiconductor substrate containing N-type impurities to form an inactive region 34. Further, a gate oxide film 38 is formed, and then a photoresist opening portion is provided at a desired position using the photolithographic technique. Thereafter, the gate oxide film 38 at the bottom of the resist opening portion is selectively removed with hydrofluoric acid or the like to form a contact hole 60, and then the photoresist is removed.

Figure 19A:
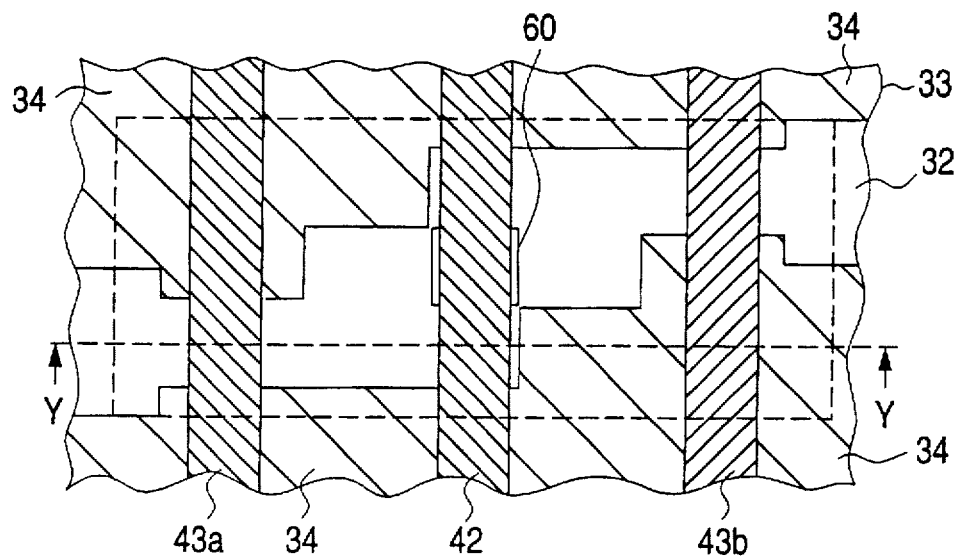
FIGS. 19A and 19B are diagrams showing a manufacturing process of the semiconductor device of the third embodiment of the present invention.
Figure 19B:
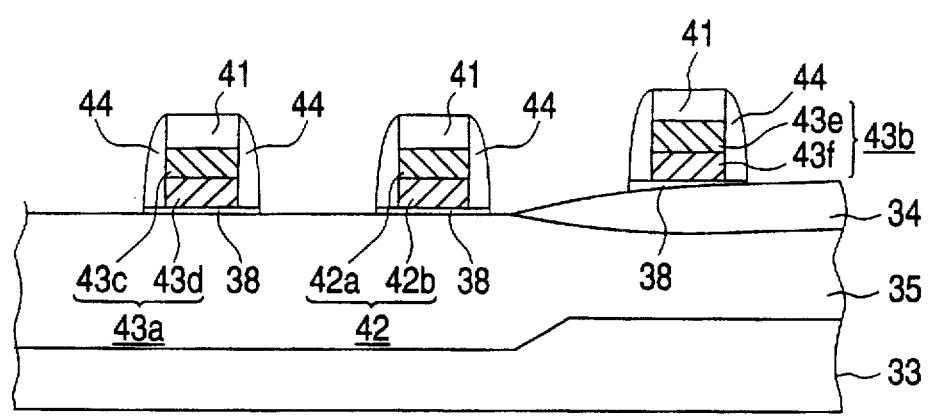

Subsequently, as shown in FIGS. 19A and 19B, like the embodiment 1, an earth wire 42 comprising a polycrystal silicon film 42b and a metal silicide layer 42a is formed, and word lines 43a and 43b comprising polycrystal silicon films 43d, 43f and metal silicide layers 43c, 43e are simultaneously formed. Further, like the embodiment 1, side walls 44 are formed at the side sections of an insulation film 41 comprising a silicon dioxide film and the other wires 42, 43a and 43b.

Figure 20A:
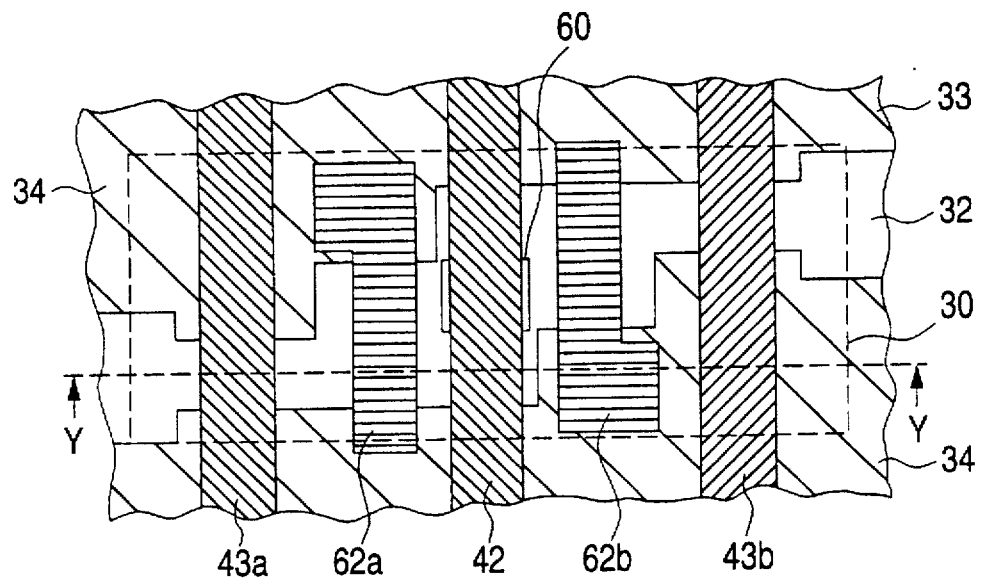
FIGS. 20A and 20B are diagrams showing a manufacturing process of the semiconductor device of the third embodiment.
Figure 20B:
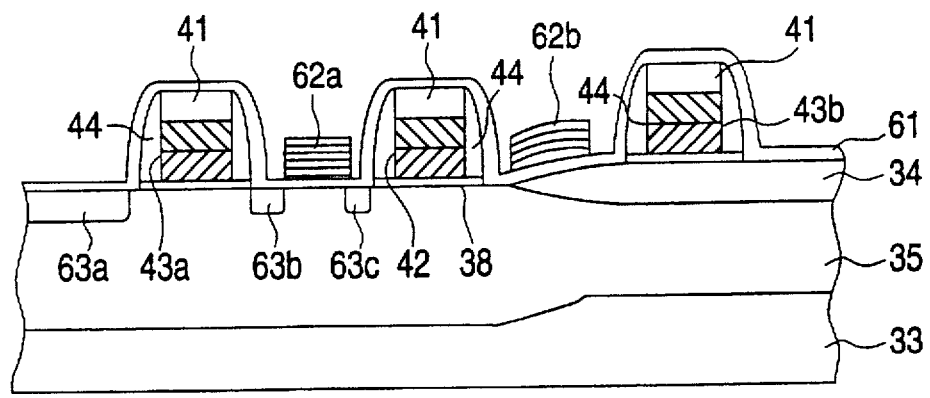

Subsequently, as shown in FIGS. 20A and 20B, a gate oxide film 61 of silicion dioxide is formed at a thickness of about 100 angstroms on the whole surface of the memory cell forming area by the thermal oxidation method or the like. Thereafter, a phosphorus-doped polycrystal silicon film having a phosphorus concentration of about 1.0 to 8.0E20 $cm^{-3}$ and a thickness of about 1500 angstroms is deposited by the LPCVD method, and then subjected to the patterning treatment to form gate electrodes 62a and 62b of the driver transistors so that the gate electrodes are arranged in parallel to the extending direction of the word lines 43a and 43b and the earth wire 42. Thereafter, for example, phosphorus is doped at a dose amount of 1.0 to 5.0E13 $cm^{-2}$ at an ion-implantation intensity of 50 keV using as a mask the photoresist used in the patterning treatment of the wiring layer to form source/drain regions 63a, 63b and 63c which comprise N-type low-concentration impurity regions of phosphorus concentration of about $10^{17}$ to $10^{18}/cm^3$, and the photoresist is removed.

Figure 21A:
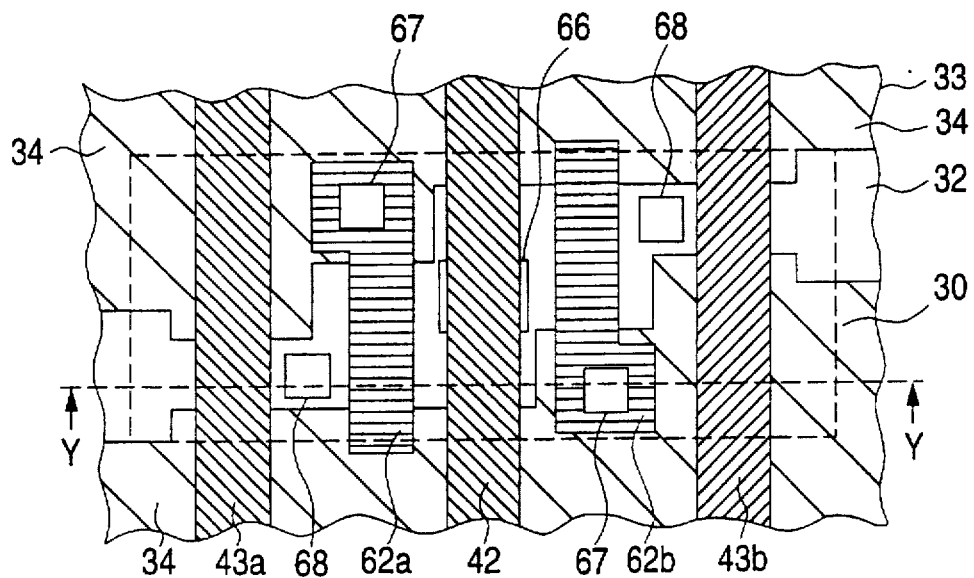
FIGS. 21A and 21B are diagrams showing a manufacturing process of the semiconductor device of the third embodiment.
Figure 21B:
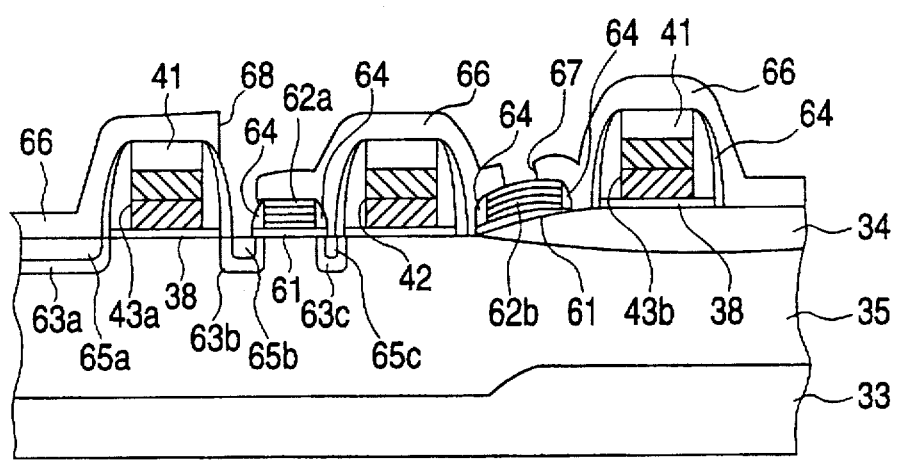

Subsequently, as shown in FIG. 21, a silicon dioxide film of about 1500 angstroms in thickness is deposited on the whole surface of the memory cell forming area by the LPCVD method, and the etching treatment is conducted by the RIE method to form a side walls 64 at the side sections of the gate electrodes 62a and 62b of the driver transistors. Subsequently, arsenic is doped at an ion-implantation intensity of 50 keV onto the whole surface of the memory cell forming area to form source/drain regions 65a, 65b and 65c which comprise N-type high-concentration impurity regions having an impurity concentration of about $10^{20}/cm^3$. With this treatment, the source/drain regions having the LDD structure can be formed.

Thereafter, the thermal treatment is performed, for example, at a temperature of 850° C. for about 30 minutes to activate the source/drain regions 65a, 65b and 65c containing the N-type impurities. Thereafter, an insulation film 66 of silicion dioxide is deposited at a thickness of about 1500 angstroms on the whole surface of the memory cell forming area by the LPCVD method, and then a photoresist is patterned into a desired shape by using the photolithographic technique. The insulation film is selectively removed using the patterned photoresist as a mask by applying the RIE method to form contact holes 67 so that parts of the gate electrodes 62a and 62b of the driver transistors are exposed to the contact holes, and also to form contact holes 68 so that parts of the N-type source/drain regions 65b is exposed to the contact holes.

Figure 22A:
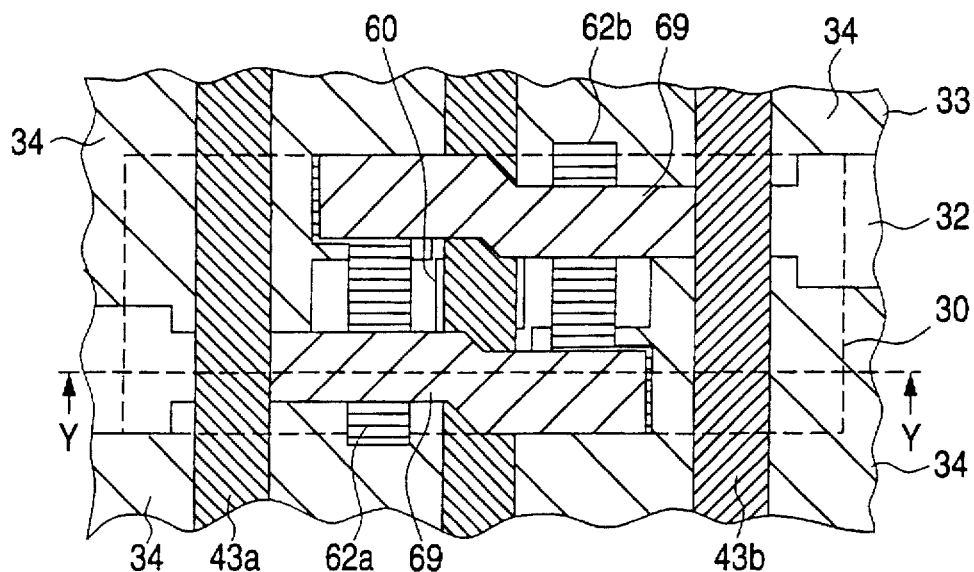
FIGS. 22A and 22B are diagrams showing a manufacturing process of the semiconductor device of the third embodiment.
Figure 22B:
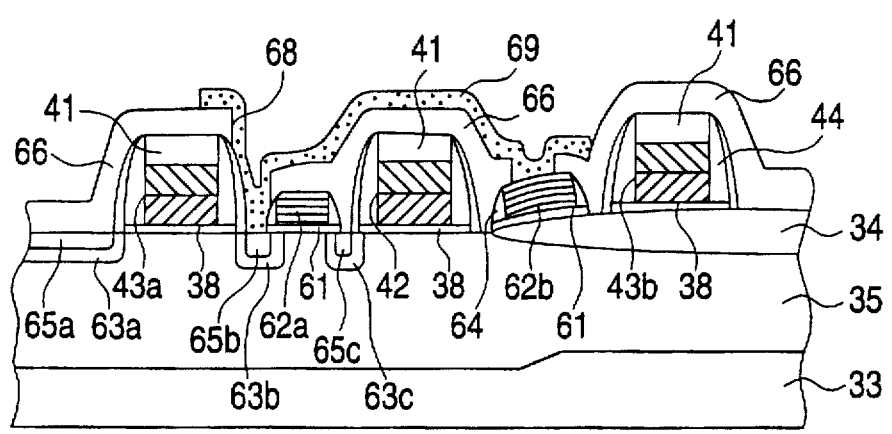

Subsequently, as shown in FIGS. 22A and 22B, a phosphorus-doped polycrystal silicon film having a thickness of about 1000 angstroms and a phosphorus-doped concentration of about 1.0 to 8.0E20 $cm^{-3}$ is deposited by the LPCVE method, and this conductive layer is subjected to the patterning treatment to form gate electrodes 69 to P-channel type TFTs which are formed as load elements.

Figure 23A:
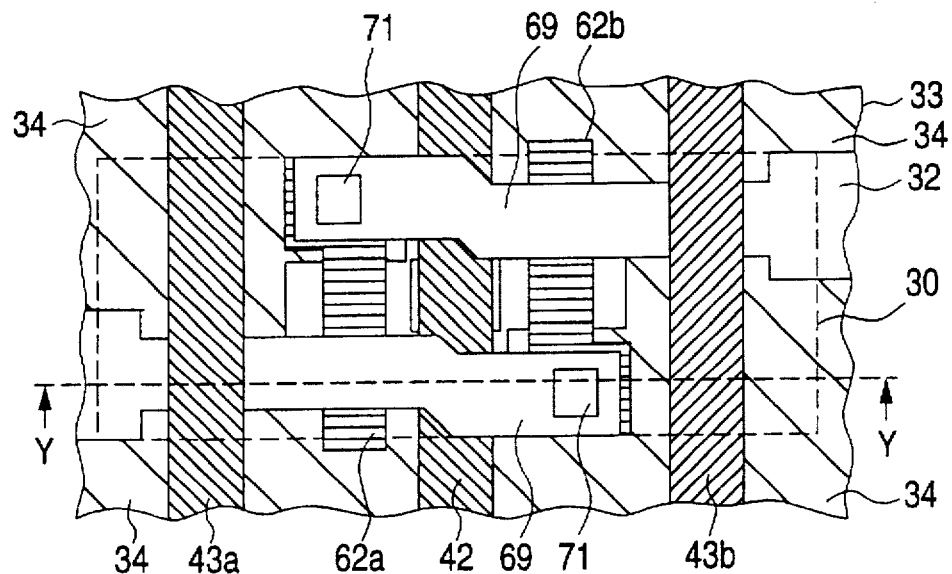
FIGS. 23A and 23B are diagrams showing a manufacturing process of the semiconductor device of the third embodiment.
Figure 23B:
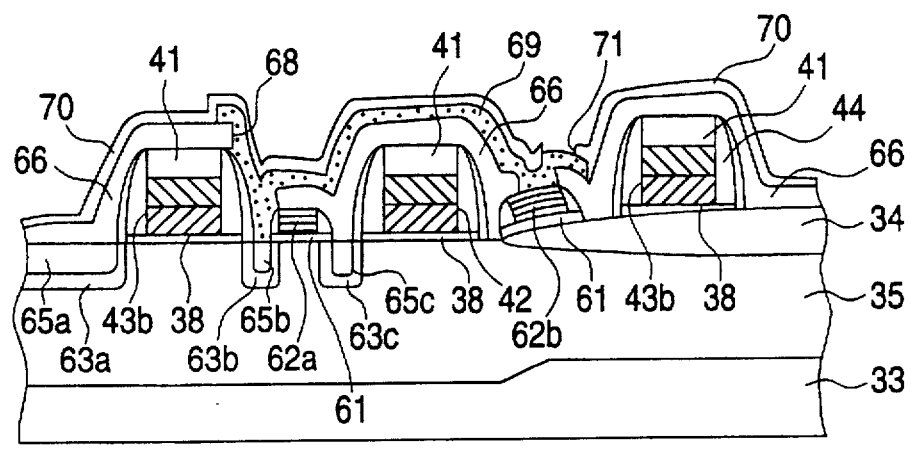
Figure 24A:
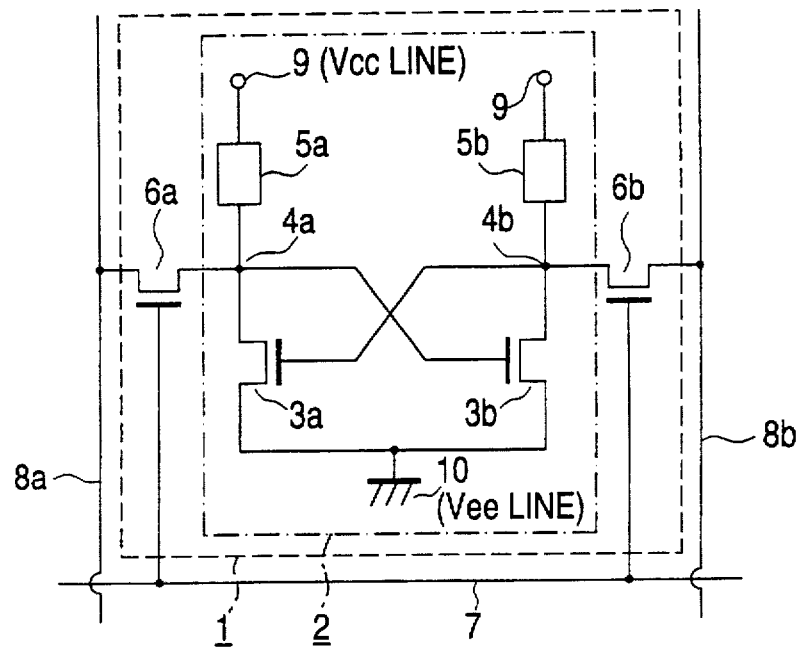
FIGS. 24A and 24B are circuit diagrams which are necessary to explain a conventional technique.
Figure 24B:
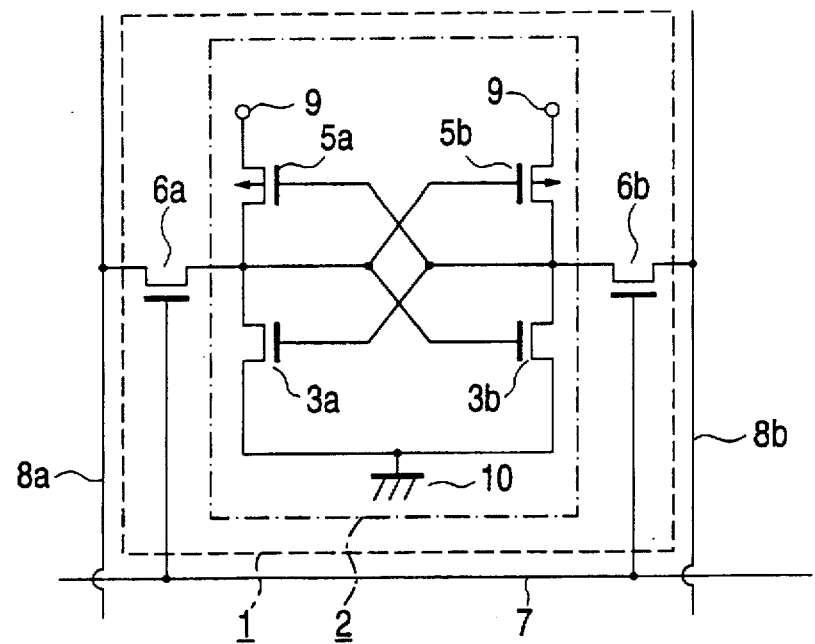
Figure 25A:
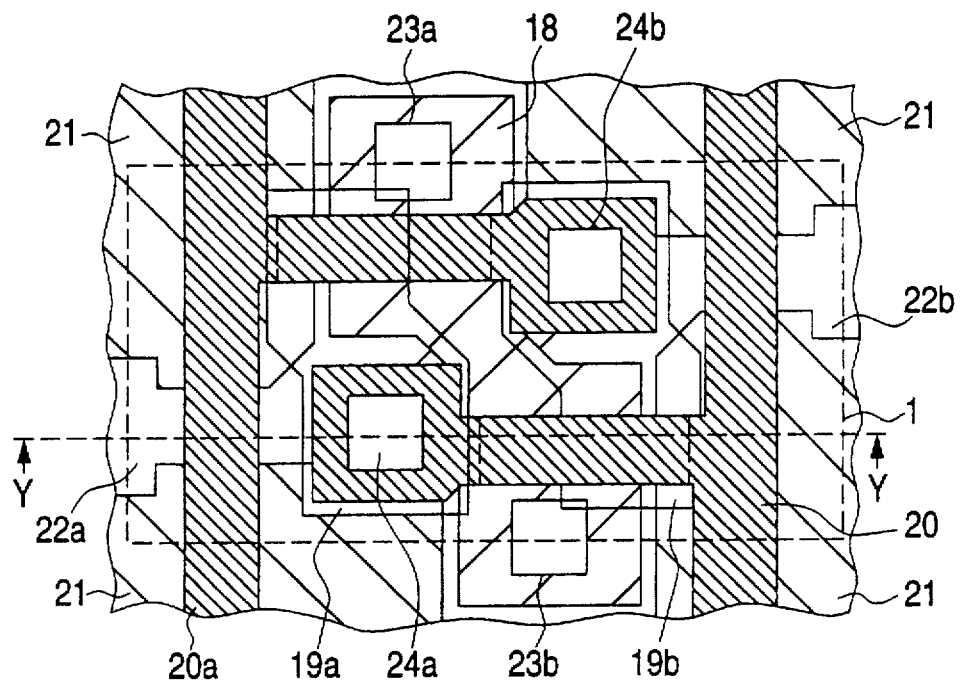
FIGS. 25A and 25B are diagrams showing a semiconductor device according to the conventional technique.
Figure 25B:
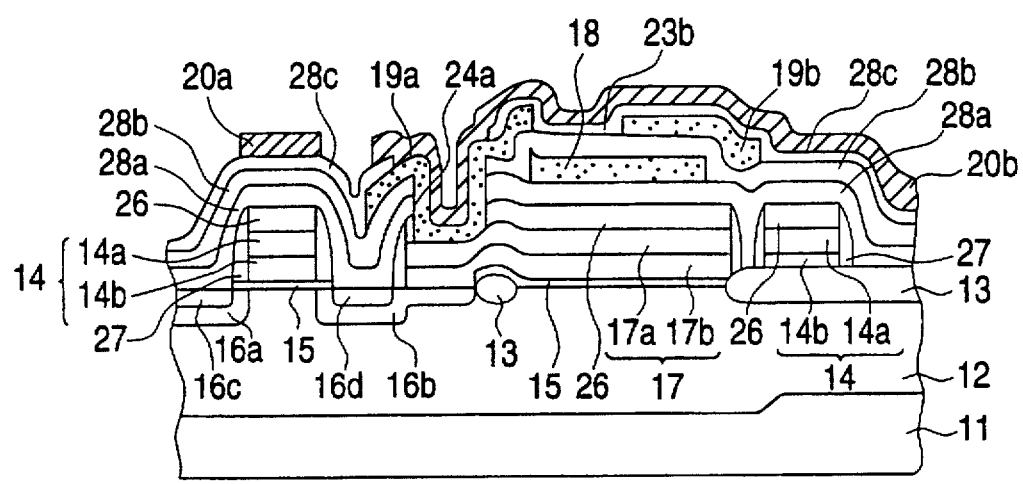
Figure 26A:
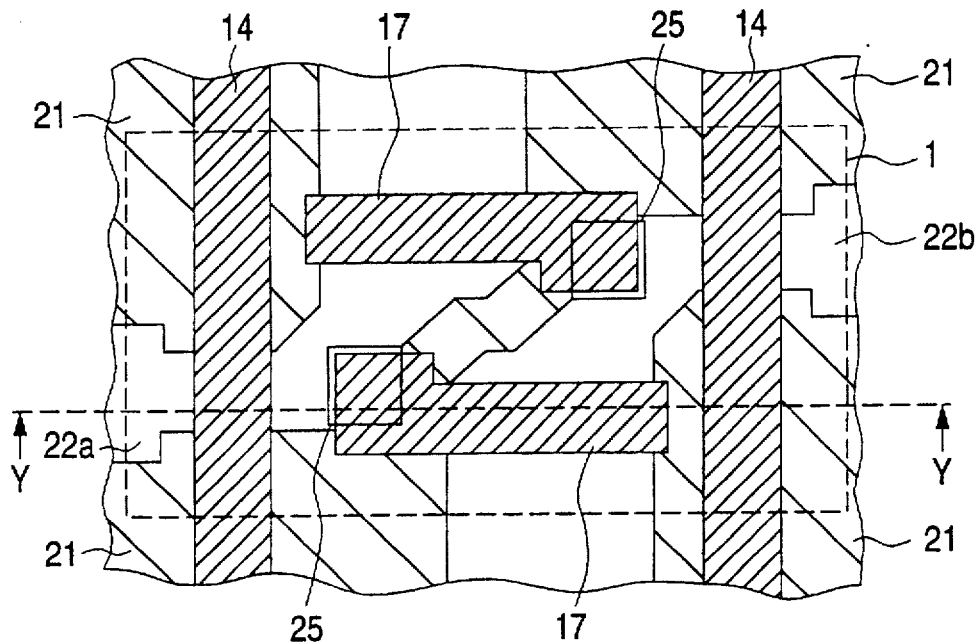
FIGS. 26A and 26B are diagrams showing a method of manufacturing the semiconductor device according to the conventional technique.
Figure 26B:
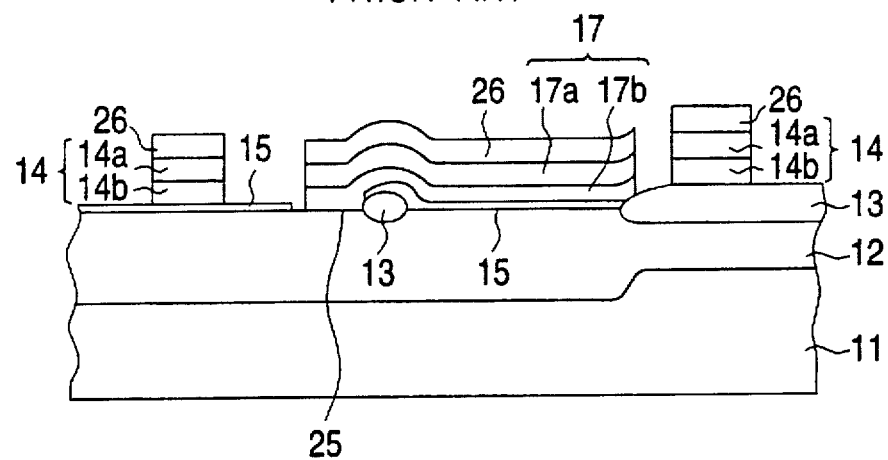
Figure 27A:
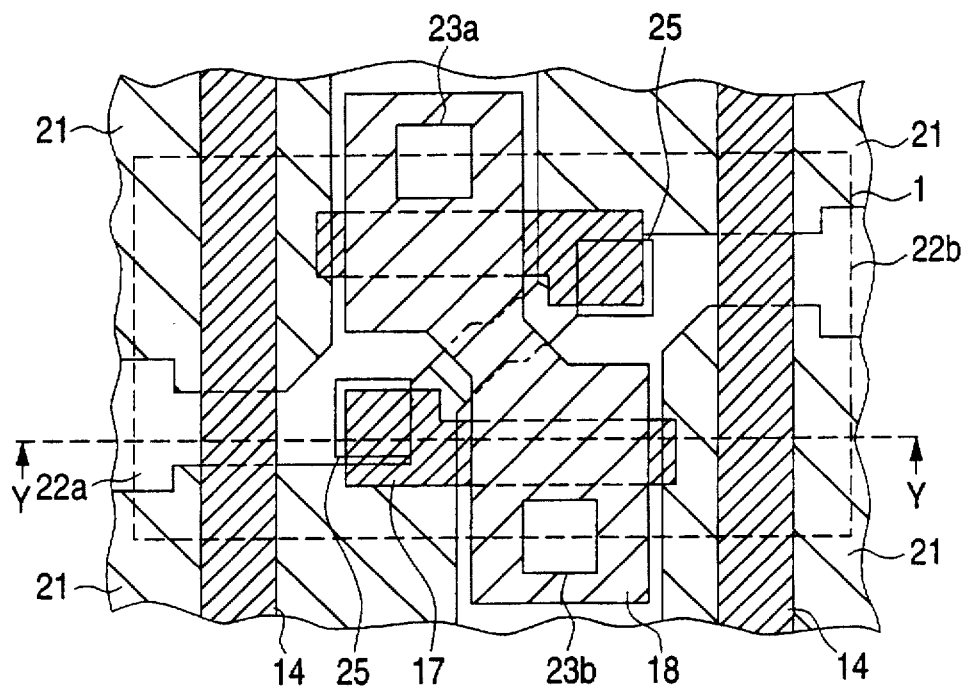
FIGS. 27A and 27B are diagrams showing a method of manufacturing the semiconductor device according to the conventional technique.
Figure 27B:
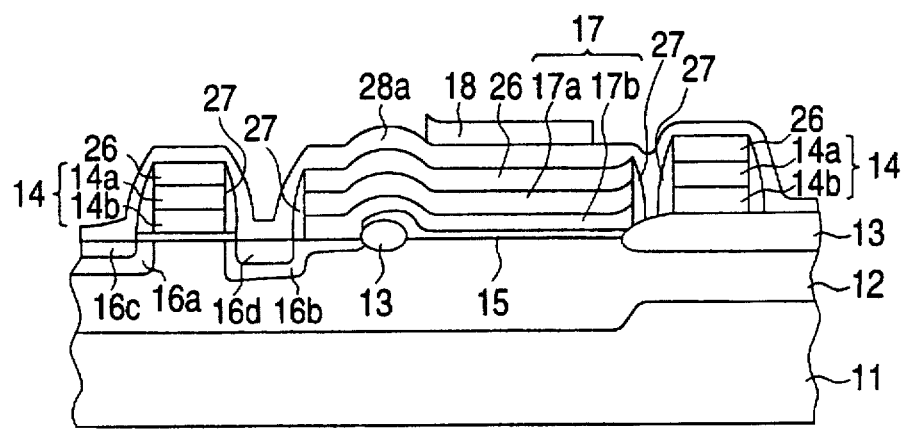

Thereafter, as shown in FIGS. 23A and 23B, an insulation film 70 of silicon dioxide is deposited at a thickness of about 300 angstroms, and then a photoresist is patterned into a desired shape by the photolithographic technique. The insulation film 70 is selectively removed using the patterned photoresist as a mask by the RIE method to form contact holes so that parts of the gate electrodes 69 of the P-channel type TFTs formed below the insulation layer 70 are exposed to the contact holes.

Subsequently, a polycrystal silicon film having a thickness of about 500 angstroms in thickness is deposited by the LPCVD method, and a photoresist is patterned into a desired shape by the photolithographic technique. Thereafter, the polycrystal silicon film is subjected to the patterning treatment using the patterned photoresist as a mask by the RIE method to form conductive films 72a and 72b which serve as the source/drain regions and the channel regions of the P-channel TFTs. Thereafter, P-type impurities are doped into the areas corresponding to the source/drain regions of the P-channel type TFTs to form source/drain regions 72e, 72f, 72g and 72h. At the same time, the channel regions 72c and 72d of the TFTs are formed. Through these processes, the semiconductor device shown in FIG. 17 can be obtained.

Thereafter, like the ordinary memory cell, layer-insulation films, contact holes, aluminum wires (bit lines), etc. are formed. These processes are performed in the same manner as the prior art, and thus the description thereof is omitted.

As described above, the gate electrodes 62a, 62b of the driver transistors can be arranged in parallel to the extending direction of the word lines 42a and 43b and the earth wire 42. In this case, like the embodiment 1, there is little unevenness in the underlayer of the earth wire 42, so that the resistance of the earth wire 42 can be reduced to a smaller value than that of the prior art. In addition, the earth wire 42 and the conductive regions 72a and 72b corresponding to the source/drain region and the channel region of the P-channel type TFT which is a load element are disposed away from each other at a longer distance than that of the prior art, so that the earth wire 42 can be prevented from action as a parasitic gate electrode, and thus it can suppress malfunction of the transistor.

As described above, according to the present invention, the earth wire is formed of the conductive layer which has a two-layer structure comprising a polycrystal silicon layer and a metal silicide layer, and are arranged not to be overlapped with each other. In addition, the unevenness of the underlayer of the earth wire is suppressed. Therefore, the wiring length of the earth wire can be shortened, and thus the wiring resistance can be reduced. In addition, the malfunction of the memory cell can be suppressed.

Furthermore, according to the present invention, the word lines and the earth wire are formed of the same conductive layer, so that the manufacturing process of the memory cells of the semiconductor device can be simplified and the wiring resistance can be reduced. Therefore, the semiconductor device of this invention can be constructed with high performance.

Still furthermore, according to the present invention, an MOS transistor which uses the earth wire as its gate electrode and is hard to be conducted is formed to electrically separate the active region formed in one memory cell into two regions. Therefore, unlike the prior art, it is unnecessary to form a field oxide film on which unevenness occurs. Accordingly, the wiring length of the wires formed on the electrically-separated regions of the active region can be reduced, so that the semiconductor device having high performance can be formed.

Still furthermore, according to the present invention, the word lines and the earth wire which are designed in the two-layer structure are formed of the same conductive layer at the same time, so that the low-resistant wires can be formed by the small number of processes, and thus the semiconductor device can be formed with high precision.

What is claimed is:

1. A semiconductor device having an SRAM, which SRAM comprises:

a semiconductor substrate having a flat surface;

an insulating film on said semiconductor substrate, a word line and an earth wire which are formed of the same layer through said insulating film of said semiconductor substrate, wherein said earth wire in at least a memory cell is a first conductive layer formed in parallel to the flat surface away from said word line without crossing, and wherein nodes are separated by an enhancement transistor.

2. A semiconductor device having an SRAM, which SRAM comprises:

a semiconductor substrate having a flat surface;

an insulating film on said semiconductor substrate, a word line and an earth wire which are formed through said insulating film on said semiconductor substrate, wherein said word line and said earth wire in at least a memory cell are first conductive layers formed in parallel to the flat surface away from each other without crossing each other, and wherein nodes are separated by an enhancement transistor.

3. A semiconductor device having an SRAM, which SRAM comprises:

a semiconductor substrate having a flat surface;

an insulating film on said semiconductor substrate, a word line and an earth wire which are formed through said insulating film on said semiconductor substrate, wherein said word line and said earth wire in at least a memory cell are first conductive layer formed of a same material in parallel to the flat surface away from each other without crossing each other, and wherein nodes are separated by an enhancement transistor.

4. The semiconductor device of claim 1, wherein said earth wire comprises metal silicide wire.

5. The semiconductor device of claim 2, wherein said earth wire comprises metal silicide wire.

6. The semiconductor device of claim 3, wherein said earth wire comprises metal silicide wire.

7. The semiconductor device of claim 1, wherein said SRAM comprises TFTs serving as load devices.

8. The semiconductor device of claim 2, wherein said SRAM comprises TFTs serving as load devices.

9. The semiconductor device of claim 3, wherein said SRAM comprises TFTs serving as load devices.

10. The semiconductor device of claim 1, wherein said SRAM comprises driver transistors including gate electrodes of a single layer of polycrystalline silicon.

11. The semiconductor device of claim 2, wherein said SRAM comprises driver transistors including gate electrodes of a single layer of polycrystalline silicon.

12. The semiconductor device of claim 3, wherein said SRAM comprises driver transistors including gate electrodes of a single layer of polycrystalline silicon.

13. A semiconductor device having an SRAM, which SRAM comprises:

a semiconductor substrate having a flat surface;

an insulting film on said semiconductor substrate;

a word line and an earth wire which are formed of the same layer through said insulating film on said semiconductor substrate, wherein said earth wire in at least a memory cell is a first conductive layer formed in parallel to the flat surface away from said word line without crossing, further including an active region formed in said semiconductor substrate, and the earth wire is formed through the insulating film on said active region, wherein said earth wire serves as a gate electrode for an enhancement transistor comprising a channel region formed by a portion of said active region beneath said earth wire.

14. A semiconductor device having an SRAM, which SRAM comprises:

a semiconductor substrate having a flat surface;

an insulating film on said semiconductor substrate, a word line and an earth wire which are formed through said insulating film on said semiconductor substrate, wherein said word line and said earth wire in at least a memory cell are first conductive layers formed in parallel to the flat surface away from each other without crossing each other, further including an active region formed in said semiconductor substrate, and the earth wire is formed through the insulating film on said active region, wherein said earth wire serves as a gate electrode for an enhancement transistor comprising a channel region formed by a portion of said active region beneath said earth wire.

15. A semiconductor device having an SRAM, which SRAM comprises:

a semiconductor substrate having a flat surface;

an insulating film on said semiconductor substrate, a word line and an earth wire which are formed through said insulating film on said semiconductor substrate, wherein said word line and said earth wire in at least a memory cell are first conductive layers formed of a same material in parallel to the flat surface away from each other without crossing each other, further including an active region formed in said semiconductor substrate, and the earth wire is formed through the insulating film on said active region, wherein said earth wire serves as a gate electrode for an enhancement transistor comprising a channel region formed by a portion of said active region beneath said earth wire.

* * * * *